(12) United States Patent
Taguchi

(10) Patent No.: US 7,741,010 B2
(45) Date of Patent: Jun. 22, 2010

(54) LASER-DECOMPOSABLE RESIN COMPOSITION AND PATTERN-FORMING MATERIAL USING THE SAME

(75) Inventor: Yoshinori Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 189 days.

(21) Appl. No.: 12/018,879

(22) Filed: Jan. 24, 2008

(65) Prior Publication Data

US 2008/0268371 A1    Oct. 30, 2008

(30) Foreign Application Priority Data

Jan. 24, 2007    (JP) .............................. 2007-014126

(51) Int. Cl.
G03F 7/00    (2006.01)
(52) U.S. Cl. ................. 430/281.1; 430/270.1; 528/114; 528/107; 528/327
(58) Field of Classification Search ........................ None
See application file for complete search history.

(56) References Cited

U.S. PATENT DOCUMENTS

| | | | |
|---|---|---|---|
| 4,609,719 A * | 9/1986 | Chattha | 528/98 |
| 4,611,047 A * | 9/1986 | Chattha | 528/114 |
| 2003/0091932 A1* | 5/2003 | Loccufier et al. | 430/272.1 |
| 2003/0111519 A1* | 6/2003 | Kinney et al. | 228/223 |
| 2006/0177771 A1* | 8/2006 | Takagi et al. | 430/300 |
| 2006/0269868 A1* | 11/2006 | Hasegawa et al. | 430/270.1 |

FOREIGN PATENT DOCUMENTS

| | | |
|---|---|---|
| JP | 8-258442 A | 10/1996 |
| JP | 10-119436 A | 5/1998 |
| JP | 10-244751 A | 9/1998 |
| JP | 2003-73470 A | 3/2003 |
| JP | 2003-119281 A | 4/2003 |
| WO | WO-2005/073265 A1 * | 8/2005 |
| WO | WO-2006/025554 A1 * | 3/2006 |

OTHER PUBLICATIONS

Choi et al, "Changes of Fluorescence Color in Novel Poly(azomethine) by the Acidity Variation", Journal of Applied Polymer Science, vol. 101,published online Apr. 25, 2006, pp. 1228-1233.*
Abd-Alla, Journal of Materials Science, vol. 27, year 1992 (No month given), pp. 6299-6302.*
Simionescu et al, Mat. Res. Innovat. year 2001 No. 4, pp. 161-165. No month given.*
Hirohiko Kanazawa et al., "Synthesis and Chemical Degradation of Thermostable Polyamide with Imine Bond for Chemical Recycling", Macromolecules, 2006, pp. 138-144, vol. 39, American Chemical Society.
Polymer J., 36, 2004, pp. 531-537.
J. Photopolym. Sci. Technol., 3, 1990, pp. 219-233.

* cited by examiner

*Primary Examiner*—Cynthia Hamilton
(74) *Attorney, Agent, or Firm*—Sughrue Mion, PLLC

(57) ABSTRACT

A laser-decomposable resin composition, includes: (A) a polymer compound containing a structure represented by formula (0) as a repeating unit in a main chain of the polymer compound:

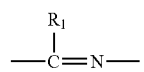

(0)

wherein $R_1$ represents H or a hydrocarbyl group which may have a substituent; and (B) a photo-latent or heat-latent catalyst, and a pattern-forming material, includes: a layer containing the laser-decomposable resin composition.

11 Claims, No Drawings

LASER-DECOMPOSABLE RESIN COMPOSITION AND PATTERN-FORMING MATERIAL USING THE SAME

BACKGROUND OF THE INVENTION

1. Field of the Invention

The present invention relates to a laser-decomposable resin composition, more specifically, a composition which can be engraved by a laser and satisfies both high decomposability and high stability, and a pattern-forming material using the composition.

2. Description of the Related Art

The decomposable resin and decomposable resin composition are a material such that the resin decomposes in response to an external factor such as thermal factor, mechanical factor, photochemical factor, radiation chemical factor and chemical factor, and are widely known. Changes caused by decomposition of the resin, that is, changes in the form (liquefaction, vaporization) between before and after decomposition of the resin or composition and changes in the nature or property such as molecular weight, hardness, viscoelasticity, glass transition temperature (Tg), solubility and adhesive property, are utilized and these resins or compositions are being used in various fields.

Examples of the decomposable resin and decomposable resin composition include a biodegradable plastic (e.g., polylactic acid) for decreasing the environmental effect of plastic materials, and a sustained-release material for gradually releasing a preparation, a fragrance or the like, which is used, for example, in the fields of medical treatments, cosmetics and life science. These are, however, a material which gradually decomposes in oxygen, light, enzyme, living body, soil or the like under a natural environment, but are not a material which stably maintains the initial state and abruptly brings about a great change in the nature by the effect of external stimulation.

In order to ensure a recycling property or simplify the waste treatment, there have been developed, for example, a resin which decomposes, or an adhesive which decreases in the adhesive property, by the effect of light or heat. It is also known to form a porous material by mixing a decomposable resin with ceramic, carbon fiber or the like and removing the decomposable resin through firing. However, these are a technique of treating and processing the material as a whole but not a technique of forming a necessary pattern only in a necessary portion. Furthermore, the decomposition treatment requires a large energy.

As for utilization in the image formation, there is known, for example, a technique of satisfying both storage stability as a toner and image fixing property by using a toner containing a thermally decomposable resin and utilizing changes in the nature due to heat at the fixing under heating. Here, however, the resin itself is not satisfactorily responsive to pattern-like stimulation.

As regards the pattern-forming material, for example, a photoresist of which pattern formation is performed by subjecting a composition containing a photoacid generator and an acid-decomposable resin to pattern-like exposure and, if desired, heat treatment to cause pattern-like decomposition of the resin and developing the resist film, is widely known as a so-called chemical amplification-type resist. Both storage stability and pattern-forming property of this composition are satisfied in a practical level, but a development process under satisfactorily controlled processing conditions is indispensable for the pattern formation and although applicable to a thin film, this composition can be hardly applied to pattern formation of a thick film, for example, in several tens of μm or more.

Furthermore, a method of forming an image by utilizing a step of imagewise irradiating laser light to partially remove (ablate) a thin film is known (see, JP-A-10-119436 (the term "JP-A" as used herein means an "unexamined published Japanese patent application")). However, examples described for the compound employed as a thermally decomposable resin are merely a normal general-purpose resin such as polyester, polycarbonate and polyurethane, and the film thickness is approximately from 1 to 2 μm at most. There is also known a case using a compound of which thermal decomposability is specified (see, JP-A-10-244751). However, even in this case, the film thickness is approximately from 1 to 2 μm at most.

As regards the mask material for use in paste printing or the like on a printed wiring board, a mask for forming a pattern of approximately from 100 to 200 μm by utilizing a photodecomposable sheet, and a production method thereof are disclosed (see, JP-A-8-258442). However, this patent publication is silent on specific compounds, and a controlled development processing is indispensable, because the pattern is formed by adjusting the degree of exposure and development.

On the other hand, as regards the technique of forming a pattern in a thick film by a simple processing, for example, pattern formation by laser processing is known, where a substrate itself is removed, deformed or discolored by the imagewise irradiation of laser light. For example, a laser marker is utilized for entering information such as lot number in products (e.g., videotape, home electric appliance) comprising various substrates. In this case, however, a normal resin or the like is directly used as the substrate itself.

In the pattern formation by laser processing, it is demanded that a laser-engraved part (trough) is swiftly formed. For this purpose, a laser-decomposable pattern-forming material having high sensitivity is necessary.

Particularly, in the case of a flexographic printing plate precursor of laser direct-drawing type (a so-called laser engravable flexographic printing plate), easy engravability by laser light (engraving sensitivity) governs the plate-making speed and therefore, a laser-engravable flexographic printing plate using a laser-decomposable resin composition having high sensitivity is demanded.

On the other hand, an imine bond is easily hydrolyzed in the presence of an acid catalyst. It is known that by utilizing this property, a polymer containing an imine bond is hydrolyzed by an acid and reduced in the molecular weight (see, JP-A-2003-73470 and H. Kanazawa, et al., Macromolecules, 39, 138-144 (2006)). Also, as for the composition of which depolymerization reaction proceeds under the action of a catalytic active species generated due to heat, there are known a depolymerization reaction by an acid generated from an acid generator (see, Y. Konno, et al., Polymer J., 36, 531-537 (2004) and JP-A-2003-119281), and depolymerization using a photoacid generator of polyphthalaldehyde (see, H. Ito et al., J. Photopolym. Sci. Technol., 3, 219-233 (1990)). In these publications, a depolymerization reaction or a resist composition is disclosed, but in a high-sensitivity system, occurrence of a decomposition reaction during production or storage of the composition can be hardly suppressed. Accordingly, a highly sensitive, highly stable composition is demanded.

SUMMARY OF THE INVENTION

An object of the present invention is to provide a laser-decomposable resin composition which is applicable also to a thick film, exhibits high engraving sensitivity, enables efficient engraving with a low laser energy and is excellent in the stability, and a pattern-forming material using the composition.

The present invention is as follows.

(1) A laser-decomposable resin composition, comprising:

(A) a polymer compound containing a structure represented by formula (0) as a repeating unit in a main chain of the polymer compound:

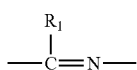

(0)

wherein $R_1$ represents H or a hydrocarbyl group which may have a substituent; and (B) a photo-latent or heat-latent catalyst.

(2) The laser-decomposable resin composition as described in (1) above, wherein the polymer compound is a polymer compound obtained by polymerizing a compound represented by formula (1) as at least one polymerization component:

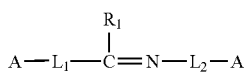

(1)

wherein $R_1$ represents H or a hydrocarbyl group which may have a substituent;

$L_1$ and $L_2$ each independently represents a divalent linking group;

A represents OH, SH, $NR_2H$, $CO_2H$, $CO_2R_2$, COX, NCO or NCS;

$R_2$ represents a hydrogen atom or a monovalent substituent; and

X represents a halogen atom.

(3) The laser-decomposable resin composition as described in (1) or (2) above, wherein the polymer compound is a polymer compound obtained by polycondensation or polyaddition reaction of the compound represented by formula (1) and a bifunctional compound capable of reacting with the compound represented by formula (1).

(4) The laser-decomposable resin composition as described in any of (1) to (3) above, wherein the polymer compound is polyurethane, polyamide, polyurea, polyether or polyester.

(5) The laser-decomposable resin composition as described in (4) above, wherein the polymer compound is polyurethane.

(6) The laser-decomposable resin composition as described in any of (1) to (5) above, wherein the heat-latent catalyst is an acid generator.

(7) The laser-decomposable resin composition as described in (1) above, wherein the polymer compound is a polymer compound obtained by polymerizing a compound represented by formula (2) as at least one polymerization component:

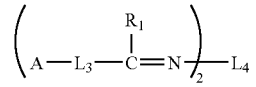

(2)

wherein $R_1$ represents H or a hydrocarbyl group which may have a substituent;

$L_3$ and $L_4$ each independently represents a divalent linking group;

A represents OH, SH, $NR_2H$, $CO_2H$, $CO_2R_2$, COX, NCO or NCS;

$R_2$ represents a hydrogen atom or a monovalent substituent; and

X represents a halogen atom.

(8) The laser-decomposable resin composition as described in (7) above, wherein the polymer compound is a polymer compound obtained by polycondensation or polyaddition reaction of the compound represented by formula (2) and a bifunctional compound capable of reacting with the compound represented by formula (2).

(9) The laser-decomposable resin composition as described in any of (1) to (8) above, which further comprises a compound containing a polymerizable unsaturated double bond.

(10) A laser-decomposable resin composition obtained by curing the laser-decomposable resin composition as described in (9) above.

(11) A pattern-forming material, comprising:

a layer comprising the laser-decomposable resin composition as described in any of (1) to (10) above.

(12) The pattern-forming material as described in (11) above, which is a laser-engravable flexographic printing plate precursor.

(13) A polymer compound obtained by polymerizing a compound represented by formula (1) as at least one polymerization component:

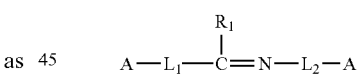

(1)

wherein $R_1$ represents H or a hydrocarbyl group which may have a substituent;

$L_1$ and $L_2$ each independently represents a divalent linking group;

A represents OH, SH, $NR_2H$, $CO_2H$, $CO_2R_2$, COX, NCO or NCS;

$R_2$ represents a hydrogen atom or a monovalent substituent; and

X represents a halogen atom.

(14) A polymer compound obtained by polymerizing a compound represented by formula (2) as at least one polymerization component:

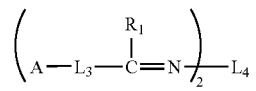

(2)

wherein $R_1$ represents H or a hydrocarbyl group which may have a substituent;

$L_3$ and $L_4$ each independently represents a divalent linking group;

A represents OH, SH, $NR_2H$, $CO_2H$, $CO_2R_2$, COX, NCO or NCS;

$R_2$ represents a hydrogen atom or a monovalent substituent; and

X represents a halogen atom.

DETAILED DESCRIPTION OF THE INVENTION

The components contained in the laser-decomposable resin composition are described in detail below.

First, (A) a polymer compound containing a structure represented by formula (0) as a repeating unit in the main chain and (B) a photo-latent or heat-latent catalyst, which are used in the present invention, are described.

(Polymer Compound Containing Structure of Formula (0) as Repeating Unit in Main Chain)

The (A) polymer compound containing a structure represented by the following formula (0) as a repeating unit in the main chain, for use in the present invention, is described. The component (A) may be an arbitrary compound as long as it is a polymer compound containing a structure represented by the following formula (0) as a repeating unit in the main chain.

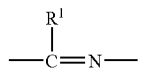

wherein $R_1$ is H or a hydrocarbyl group which may have a substituent (the hydrocarbyl group is a group after removing one hydrogen atom from a hydrocarbon group).

Examples of the hydrocarbyl group include a linear, branched or cyclic alkyl or alkenyl group having a carbon number of 22 or less and an aryl or aralkyl group having a carbon number of 22 or less. These groups each may further have a substituent, and examples of the substituent include a halogen atom, a hydroxy group, a hydrocarboxy group, a carboxy group, an ester group, a ketone group, a cyano group, an amino group, an amido group and a nitro group. Incidentally, the hydrocarbyl group as used in the present invention includes a hydrocarbyl group containing in the carbon chain thereof an oxygen atom, a nitrogen atom or a sulfur atom group.

Specific examples of the polymer compound containing a structure represented by formula (0) as a repeating unit in the main chain are set forth below, but the present invention is not limited thereto. In specific examples below, the molecular weight is a mass average (weight average) molecular weight (Mw) and indicates a value measured by the gel permeation chromatography (GPC) using polystyrene as a standard substance.

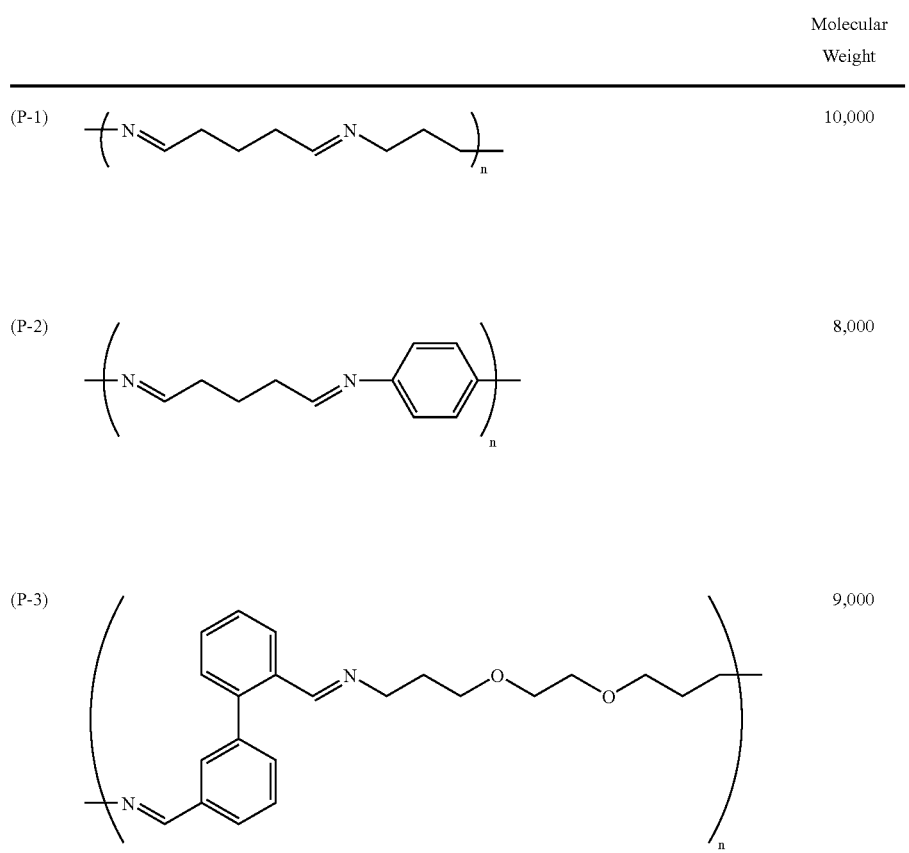

-continued

| | | Molecular Weight |
|---|---|---|
| (P-4) | [structure] | 11,000 |
| (P-5) | [structure] | 9,000 |
| (P-6) | [structure] | 10,000 |
| (P-7) | [structure] | 15,000 |
| (P-8) | [structure] | 9,000 |
| (P-9) | [structure] | 8,000 |
| (P-10) | [structure] | 11,000 |

-continued

| | Molecular Weight |
|---|---|
| (P-11) 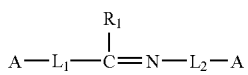 | 10,000 |

The polymer compound containing a structure represented by formula (0) as a repeating unit in the main chain, for use in the present invention, is, in view of production suitability, preferably a polymer compound obtained by polymerizing a compound of formula (1) as at least one polymerization component and, in view of additionally decomposability and engraving sensitivity, more preferably a polymer compound obtained by polymerizing a compound represented by the following formula (2) as at least one polymerization component.

The compound represented by formula (1) for use in the present invention is described below.

$$A-L_1-\underset{\underset{R_1}{|}}{C}=N-L_2-A \qquad (1)$$

In formula (1), $R_1$ is H or a hydrocarbyl group which may have a substituent. Examples of the hydrocarbyl group include a linear, branched or cyclic alkyl or alkenyl group having a carbon number of 22 or less, and an aryl or aralkyl group having a carbon number of 22 or less. These groups each may further have a substituent, and examples of the substituent include a halogen atom, a hydroxy group, a hydrocarboxy group, a carboxy group, an ester group, a ketone group, a cyano group, an amino group, an amido group and a nitro group. Incidentally, the hydrocarbyl group as used in the present invention includes a hydrocarbyl group containing in the carbon chain thereof an oxygen atom, a nitrogen atom or a sulfur atom.

In formula (1), $L_1$ and $L_2$ each is independently a divalent linking group, preferably a linear, branched or cyclic alkylene or vinylene group having a carbon number of 22 or less, or an arylene or aralkylene group having a carbon number of 22 or less. These groups each may further have a substituent, and examples of the substituent include a halogen atom, a hydroxy group, a carboxy group, a hydrocarboxy group, an ester group, a ketone group, a cyano group, an amino group, an amido group and a nitro group. Furthermore, a divalent linking group containing in the carbon chain thereof an oxygen atom, a nitrogen atom or a sulfur atom is also included.

As for $L_1$ and $L_2$, either one of $L_1$ and $L_2$ is preferably an arylene group in view of decomposability and easy availability of the raw material. The arylene group is not particularly limited but above all, a phenylene group is preferred.

In formula (1), A is OH, SH, $NR_2H$, $CO_2H$, $CO_2R_2$, COX, NCO or NCS, and $R_2$ is a hydrogen atom or a monovalent substituent, for example, a hydrocarbyl group which may have a substituent. Examples of the hydrocarbyl group include a linear, branched or cyclic alkyl or alkenyl group having a carbon number of 22 or less, and an aryl or aralkyl group having a carbon number of 22 or less. These groups each may further have a substituent, and examples of the substituent include a halogen atom, a hydroxy group, a hydrocarboxy group, a carboxy group, an ester group, a ketone group, a cyano group, an amino group, an amido group and a nitro group. Incidentally, the hydrocarbyl group as used in the present invention includes a hydrocarbyl group containing in the carbon chain thereof an oxygen atom, a nitrogen atom or a sulfur atom. X represents a halogen atom.

Specific examples of the compound represented by formula (1) are set forth below, but the present invention is not limited thereto.

(A-1)

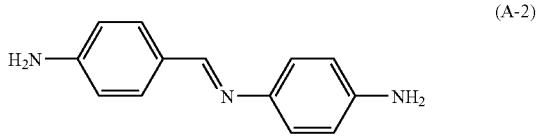
(A-2)

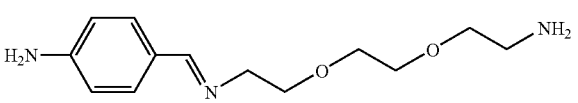
(A-3)

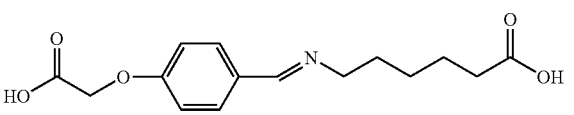
(A-4)

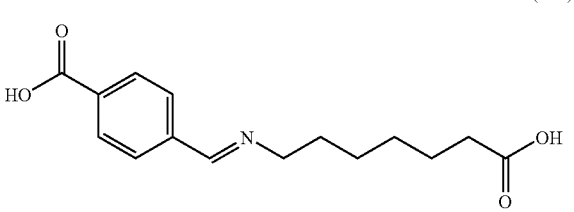
(A-5)

-continued
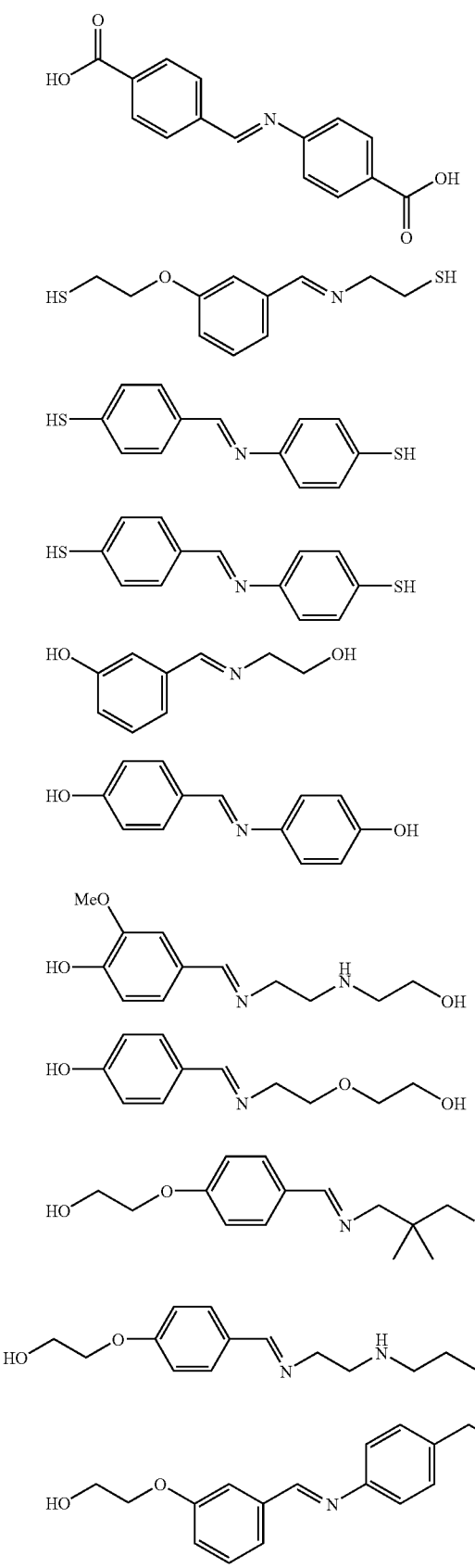
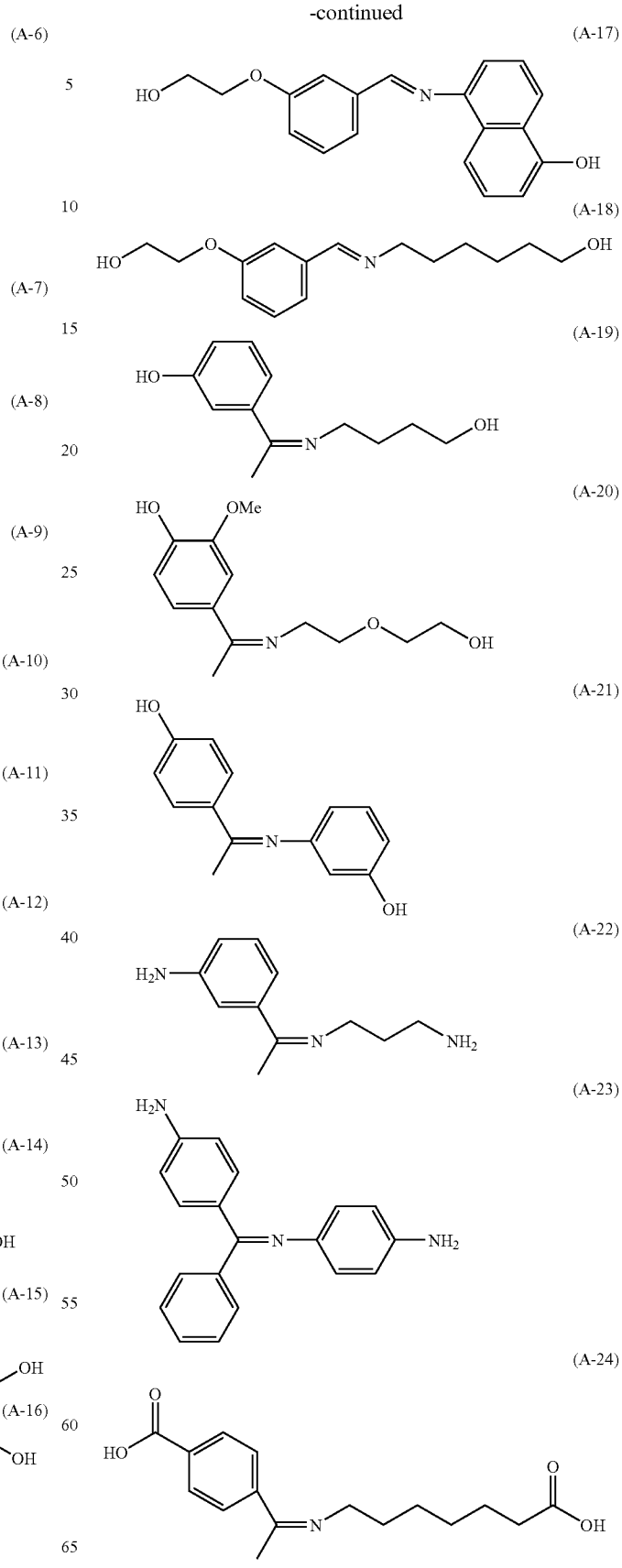

The polymer compound obtained by polymerizing a compound represented by formula (1) as at least one polymerization component includes a polymer compound obtained by the polycondensation or polyaddition reaction of a compound represented by formula (1) and a bifunctional compound capable of reacting with the compound of formula (1). This polymer compound may be any polymer compound, but preferred examples thereof include polyesters, polyamides and polyethers obtained by a polycondensation reaction, and polyureas and polyurethanes obtained by a polyaddition reaction. In view of physical properties of the polymer obtained, polyurethanes are more preferred. As for the bifunctional compound used in the reaction, a diamine compound, a dicarboxylic acid or a derivative thereof, a diisocyanate compound and a diol compound are preferred.

Examples of the diamine compound include the followings:

an aliphatic diamine such as ethylenediamine, 1,3-diaminopropane, 1,2-diaminopropane, 1,4-diaminobutane, 1,2-diamino-2-methylpropane, 1,5-diaminopentane, 2,2-dimethyl-1,3-propanediamine, hexamethylenediamine, 1,7-diaminoheptane, 1,8-diaminooctane, 1,10-diaminodecene, 4,4'-methylenebis(cyclohexylamine), 1,2-diaminocyclohexane, 1,4-diaminocyclohexane, isophoronediamine, 2,2'-(ethylenedioxy)bis(ethyleneamine) and 4,7,10-trioxa-1,13-tridecanediamine; and an aromatic diamine such as 1,2-phenylenediamine, 2,3-diaminotoluene, 3,4-diaminotoluene, 4-chloro-1,2-phenylenediamine, 4,5-dimethyl-1,2-phenylenediamine, 4,5-dichloro-1,2-phenylenediamine, 1,3-phenylenediamine, 2,6-diaminotoluene, 2,4-diaminotoluene, 2,4,6-trimethyl-1,3-phenylenediamine, 1,4-phenylenediamine, 2,5-dimethyl-1,4-phenylenediamine, 2,5-dichloro-1,4-phenylenediamine, 4,4'-(hexafluoroisopropylidene)diamine, 2,3-diaminonaphthalene, 1,5-diaminonaphthalene, p-xylenediamine, 4-aminobenzylamine, 2-(4-aminophenyl)ethyleneamine, bis(4-aminophenylmethane) and bis(4-aminophenyl)ether. Among these, an aromatic-containing diamine compound and an aliphatic diamine compound having a carbon number of 2 to 10 are preferred.

Examples of the dicarboxylic acid or a derivative thereof include a dicarboxylic acid such as succinic acid, adipic acid, azelaic acid, sebacic acid, phthalic acid, isophthalic acid, terephthalic acid, tetrahydrophthalic acid, hexahydrophthalic acid, tetrabromophthalic acid, tetrachlorophthalic acid, 1,4-cyclohexanedicarboxylic acid, norbornanecarboxylic acid, 5-sodium sulfoisophthalic acid, 4-hydroxybenzylidenemalonic acid and 3-hydroxyphthalic acid, and derivatives thereof. Among these, an aromatic-containing dicarboxylic acid or a derivative thereof, and an aliphatic dicarboxylic acid having a carbon number of 2 to 10 or a derivative thereof are preferred.

The polyamides can be easily produced by the method described, for example, in Shin-Kobunshi Jikken-Gaku 3, Kobunshi no Gosei•Hanno (2) (New Polymer Experiments 3, Synthesis and Reaction of Polymers (2)), compiled by The Society of Polymer Science, Japan, published by Kyoritsu Publishing Co.

The diisocyanate compound is represented by formula (4), and the diol compound is represented by formula (5). In formulae (4) and (5), $X^0$ and $Y^0$ each independently represents a divalent organic residue.

Specific examples of the diisocyanate compound represented by formula (4) include: an aromatic diisocyanate compound such as 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate and 3,3'-dimethylbiphenyl-4,4'-diisocyanate; an aliphatic diisocyanate compound such as hexamethylene diisocyanate, trimethylhexamethylene diisocyanate, lysine diisocyanate, and dimer acid diisocyanate; an alicyclic diisocyanate compound such as isophorone diisocyanate, 4,4'-methylene-bis(cyclohexyl isocyanate), methylcyclohexane-2,4(or 2,6)-diisocyanate, 1,3-(isocyanate methyl)cyclohexane; and a diisocyanate compound which is a reactant of a diol and a diisocyanate, such as adduct of 1 mol of 1,3-butylene glycol and 2 mol of tolylene diisocyanate.

Examples of the diol compound represented by formula (5) widely include a polyether diol compound, a polyester diol compound and a polycarbonate diol compound.

The polyether diol compound includes compounds represented by the following formulae (7), (8), (9), (10) and (11), and a random copolymer of ethylene oxide having a hydroxyl group at the terminal and propylene oxide.

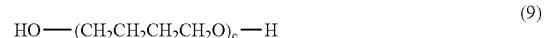

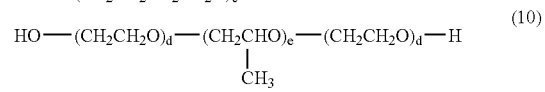

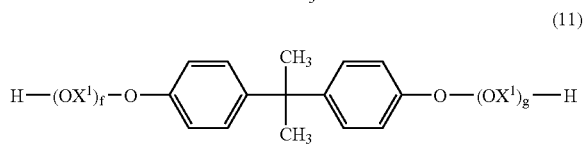

In formulae (7) to (11), $R^{14}$ represents a hydrogen atom or a methyl group, $X^1$ represents a group shown below, and a, b, c, d, e, f and g each represents an integer of 2 or more and is preferably an integer of 2 to 100.

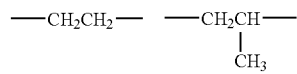

Specific examples of the polyether diol compounds represented by formulae (7) and (8) include: diethylene glycol, triethylene glycol, tetraethylene glycol, pentaethylene glycol, hexaethyene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a mass average molecular weight of 1,000, polyethylene glycol having a mass average molecular weight of 1,500, polyethylene glycol having a mass average molecular weight of 2,000, polyethylene glycol having a mass average molecular weight of 3,000, polyethylene glycol having a mass average molecular weight of 7,500, polypropylene glycol having a mass average molecular weight of 400, polypropylene glycol having a mass average molecular weight of 700, polypropylene glycol having a mass average molecular weight of 1,000, polypropylene glycol having a mass average molecular weight of 2,000, polypropylene glycol having a mass average molecular weight of 3,000, and polypropylene glycol having a mass average molecular weight of 4,000.

Specific examples of the polyether diol compound represented by formula (9) include: PTMG650, PTMG1000, PTMG2000 and PTMG13000 (trade names) produced by Sanyo Chemical Industries Co., Ltd.

Specific examples of the polyether diol compound represented by formula (10) include: NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 and NEWPOL PE-61 (trade names) produced by Sanyo Chemical Industries Co., Ltd.

Specific examples of the polyether diol compound represented by formula (11) include: NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P and NEWPOL BPE-5P (trade names) produced by Sanyo Chemical Industries Co., Ltd.

Specific examples of the random copolymer of ethylene oxide having a hydroxyl group at the terminal and propylene oxide include: NEWPOL 50HB-100, NEWPOL 50HB-260, NEWPOL 50HB-400, NEWPOL 50HB-660, NEWPOL 50HB-2000 and NEWPOL 50HB-5100 (trade names) produced by Sanyo Chemical Industries Co., Ltd.

The polyester diol compound includes compounds represented by formulae (12) and (13).

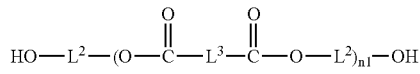
(12)

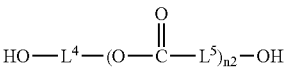
(13)

In formulae (12) and (13), $L^2$, $L^3$ and $L^4$ each may be the same or different and represents a divalent aliphatic or aromatic hydrocarbon group, and $L^5$ represents a divalent aliphatic hydrocarbon group. Preferably, $L^2$ to $L^4$ each represents an alkylene group, an alkenylene group, an alkynylene group or an arylene group, and $L^5$ represents an alkylene group. In $L^2$ to $L^5$, another functional group incapable of reacting with an isocyanate group, such as ether, carbonyl, ester, cyano, olefin, urethane, amide or ureido group or halogen atom, may be present. n1 and n2 each represents an integer of 2 or more and is preferably an integer of 2 to 100.

The polycarbonate diol compound includes a compound represented by formula (14).

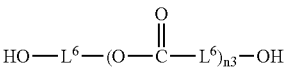
(14)

In formula (14), $L^6$ may be the same or different and represents a divalent aliphatic or aromatic hydrocarbon group. $L^6$ preferably represents an alkylene group, an alkenylene group, an alkynylene group or an arylene group. Also, in $L^6$, another functional group incapable of reacting with an isocyanate group, such as ether, carbonyl, ester, cyano, olefin, urethane, amide or ureido group or halogen atom, may be present. n3 represents an integer of 2 or more and is preferably an integer of 2 to 100.

Specific examples of the diol compounds represented by formulae (12), (13) and (14) include (Compound No. 1) to (Compound No. 18) shown below. In specific examples, n represents an integer of 2 or more.

(No. 1)

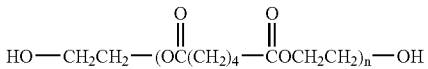
(No. 2)

(No. 3)

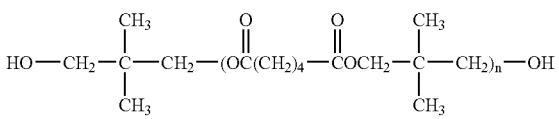
(No. 4)

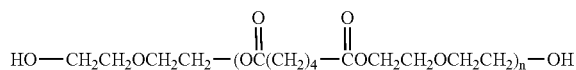
(No. 5)

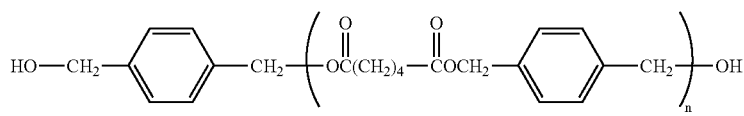
(No. 6)

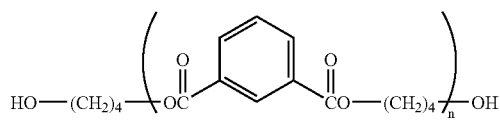
(No. 7)

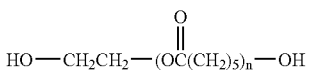
(No. 8)

-continued (No. 9) 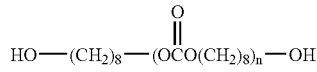

(No. 10) 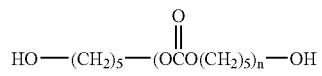

(No. 11) 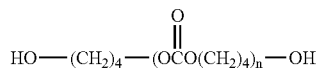

(No. 12) 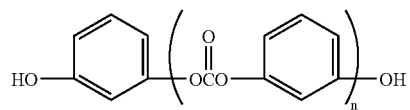

(No. 13) 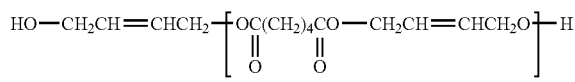

(No. 14) 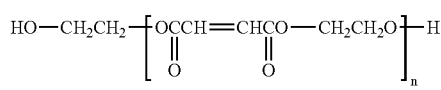

(No. 15) 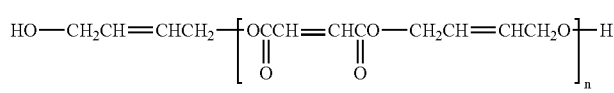

(No. 16) 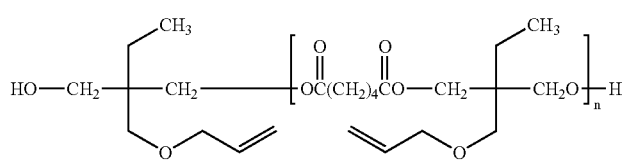

(No. 17)

(No. 18)

$m = 2, 4$

Specific examples of the polymer compound obtained by polymerizing a compound represented by formula (1) as at least one polymerization component are set forth below, but the present invention is not limited thereto. Incidentally, in the present invention, in view of engraving sensitivity and stability, the polymerization unit obtained from the compound represented by formula (1) is preferably contained in the polymer in an amount of 1 to 80 mass %, more preferably from 10 to 60 mass %. (In this specification, mass ratio is equal to weight ratio.)

| | | Molecular Weight |
|---|---|---|
| $P_A$-1 |  (A-1) | 20,000 |
| $P_A$-2 |  (A-2) | 15,000 |
| $P_A$-3 |  (A-23) | 18,000 |
| $P_A$-4 |  (A-4) | 13,000 |

-continued
| | | Molecular Weight |
|---|---|---|
| $P_A$-5 | 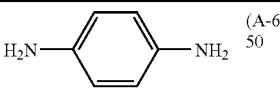 (A-6) 50 | 21,000 |
| $P_A$-6 | 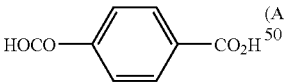 (A-10) 50 | 19,000 |
| $P_A$-7 | 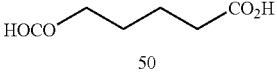 (A-15) 50 | 13,000 |
| $P_A$-8 | 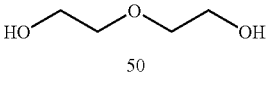 (A-5) 50 | 19,000 |
| $P_A$-9 | 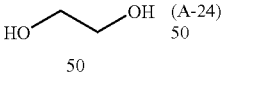 (A-24) 50 | 30,000 |
| $P_A$-10 | 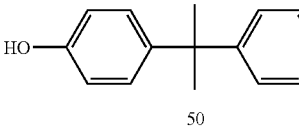 (A-4) 50 | 25,000 |
| $P_A$-11 | 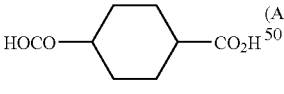 (A-7) 50 | 20,000 |
| $P_A$-12 | MDI 50   (A-14) 50 | 32,000 |
| $P_A$-13 | MDI 25   HMDI 25   TDI 25   (A-15) 25 | 35,000 |
| $P_A$-14 | MDI 40   HMDI 10   PEG Mw = 700 25   (A-16) 25 | 40,000 |
| $P_A$-15 | TDI 50   PPG Mw = 1000 10   (A-18) 40 | 38,000 |
| $P_A$-16 | 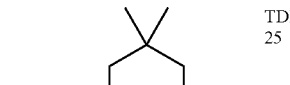 25   TDI 25   (A-13) 50 | 37,000 |
| $P_A$-17 | 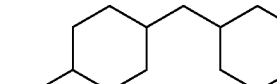 50   PPG Mw = 1000 5   (A-10) 45 | 20,000 |
| $P_A$-18 | MDI 50   PPG Mw = 1000 25   (A-11) 25 | 25,000 |
| $P_A$-19 | MDI 30   HMDI 25   DEG 30   (A-19) 20 | 24,000 |

-continued

| | | | | | | Molecular Weight |
|---|---|---|---|---|---|---|
| $P_A$-20 | MDI 50 | TEG 30 | (A-21) 20 | | | 38,000 |
| $P_A$-21 | MDI 25 | HMDI 25 | PEG Mw = 700 10 | HO~~~~OH 20 | (A-18) 20 | 35,000 |
| $P_A$-22 | MDI 25 | HMDI 25 | PEG Mw = 1000 10 | HO~~~~~~OH 20 | (A-19) 20 | 28,000 |
| $P_A$-23 | MDI 40 | HMDI 10 | [structure, Mw = 1500] 10 | | (A-18) 40 | 41,000 |
| $P_A$-24 | TDI 50 | [structure with COOH] 25 | (A-18) 25 | | | 39,000 |
| $P_A$-25 | MDI 40 | HMDI 10 | HO~~~~OH 25 | (A-1) 25 | | 40,000 |
| $P_A$-26 | MDI 50 | PEG Mw = 2500 10 | (A-7) 40 | | | 38,000 |
| $P_A$-27 | TDI 50 | PEG Mw = 700 10 | PPG Mw = 700 10 | (A-9) 30 | | 30,000 |
| $P_A$-28 | MDI 30 | HMDI 20 | (A-23) 50 | | | 13,000 |

In the Tables above, the numerical value below the compound is mol %, and the molecular weight is the mass average molecular weight.

In the Tables, compounds denoted by abbreviations in PA-1 to PA-28 and PB-1 to PB-41 are shown below.

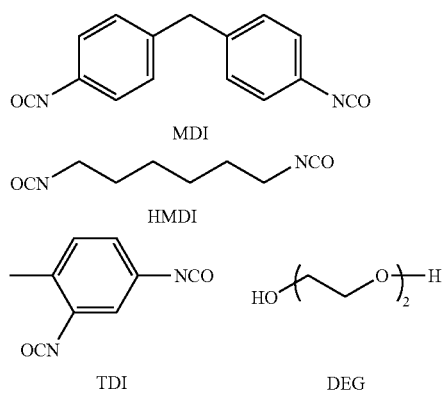

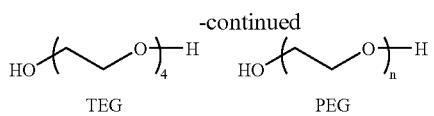

TEG      PEG

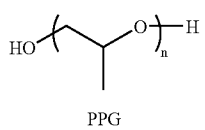

PPG

As described above, in view of production suitability, decomposability and engraving sensitivity, the compound containing a structure represented by formula (0) as a repeating unit in the main chain of the present invention is more preferably a compound obtained by polymerizing a compound represented by the following formula (2) as at least one polymerization component. The compound represented by formula (2) for use in the present invention is described below.

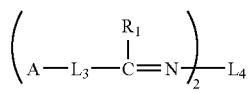

In Formula (2), $R_1$ has the same meaning as $R_1$ in formula (1), and $L_3$ and $L_4$ each is a divalent linking group similarly to $L_1$ and $L_2$ in formula (1) and is preferably a linear, branched or cyclic alkylene or vinylene group having a carbon number of 22 or less, or an arylene or aralkylene group having a carbon number of 22 or less. These groups each may further have a substituent, and examples of the substituent include a halogen atom, a hydroxy group, a carboxy group, a hydrocarboxy group, an ester group, a ketone group, a cyano group, an amino group, an amido group and a nitro group. Furthermore, a divalent linking group containing in the carbon chain thereof an oxygen atom, a nitrogen atom or a sulfur atom is also included. A in the formula also has the same meaning as A in formula (1).

As for $L_3$ and $L_4$, in view of decomposability and easy availability of the raw material, either one of $L_3$ and $L_4$ is preferably an arylene group. The arylene group is not particularly limited but above all, a phenylene group is preferred.

Specific examples of the compound represented by formula (2) are set forth below, but the present invention is not limited thereto.

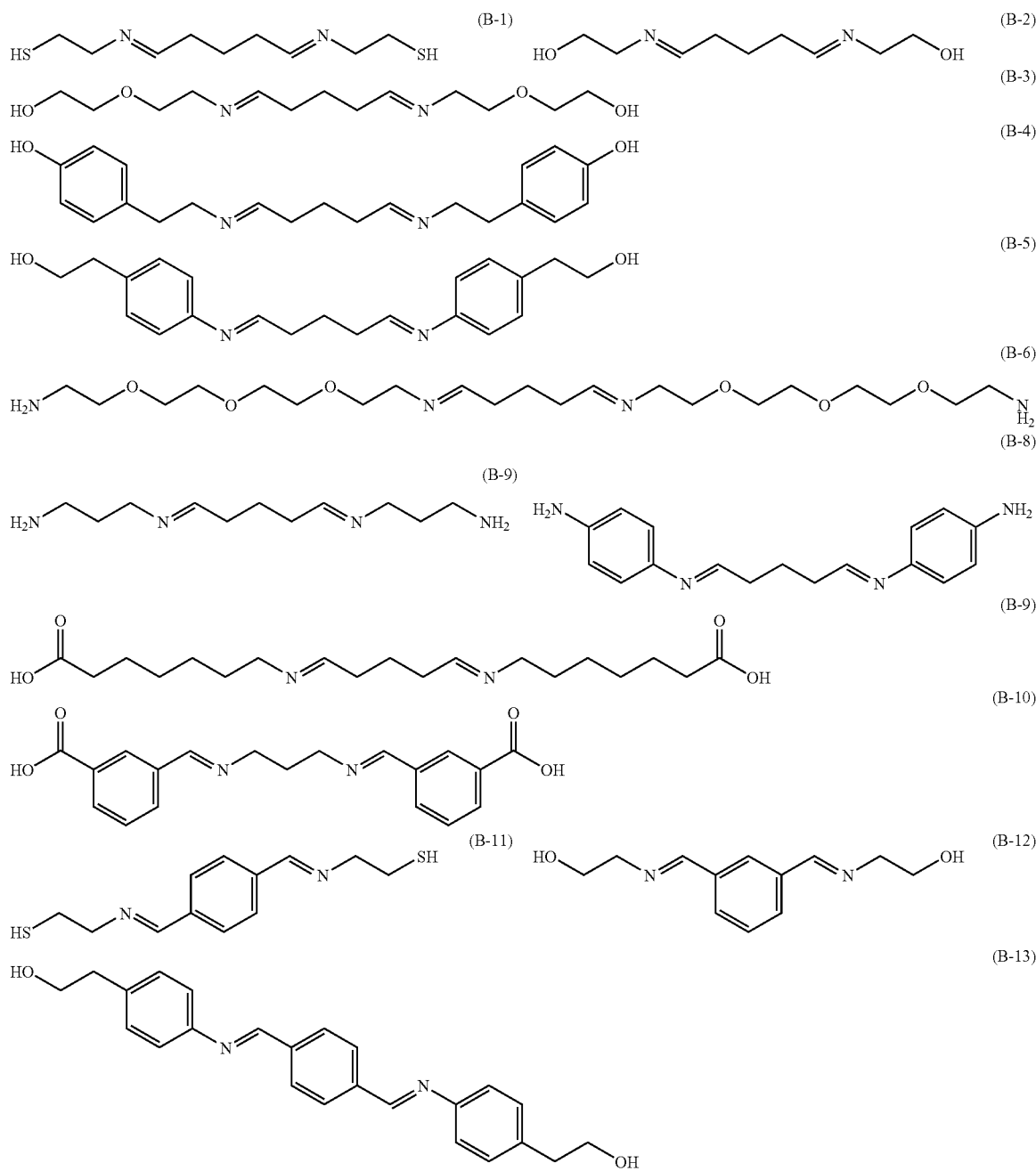

-continued
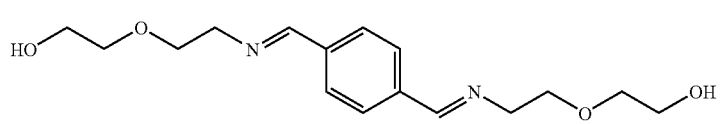
(B-14)
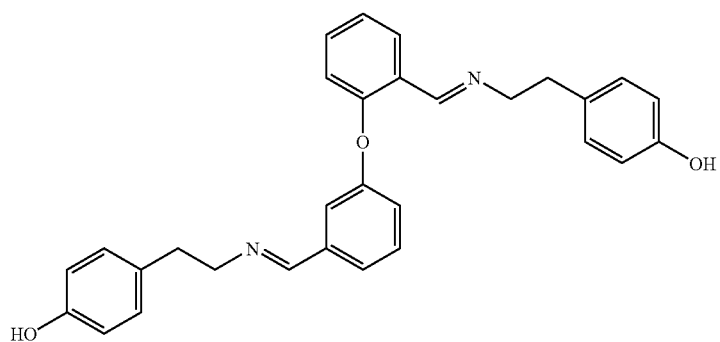
(B-15)
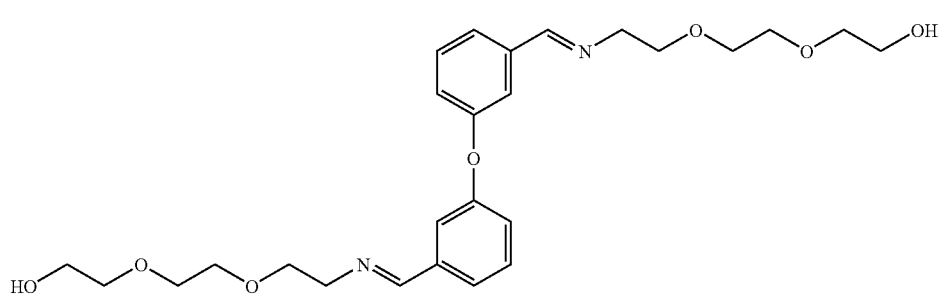
(B-16)
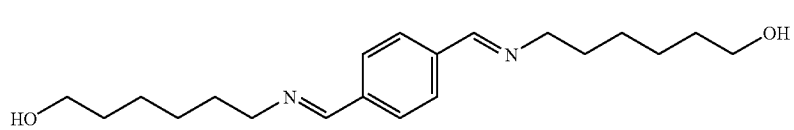
(B-17)
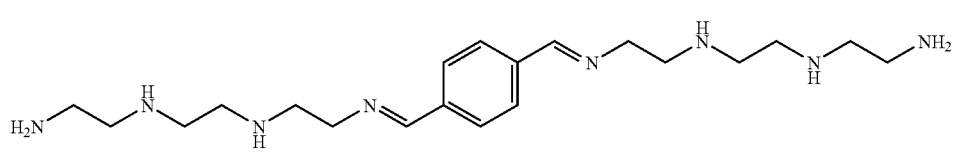
(B-18)
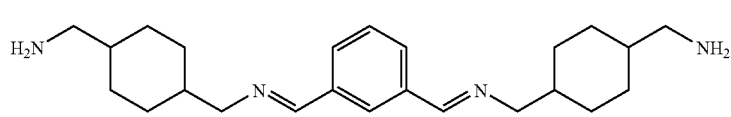
(B-19)
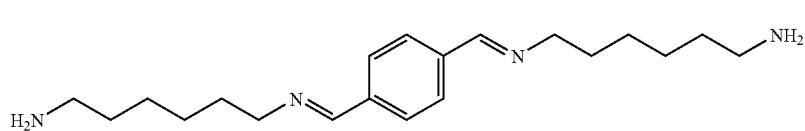
(B-20)
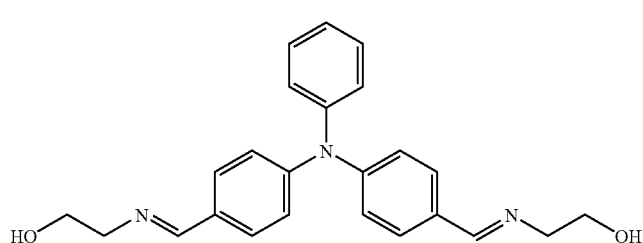
(B-21)

-continued
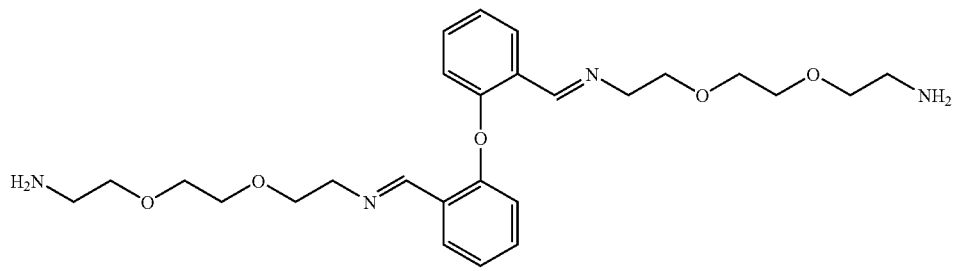 (B-22)
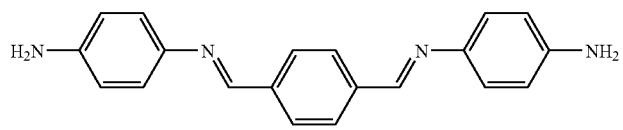 (B-23)
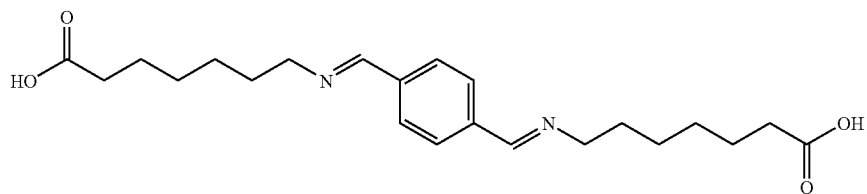 (B-24)
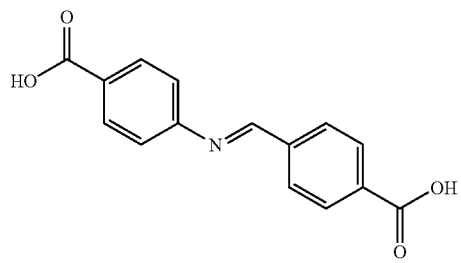 (B-25)
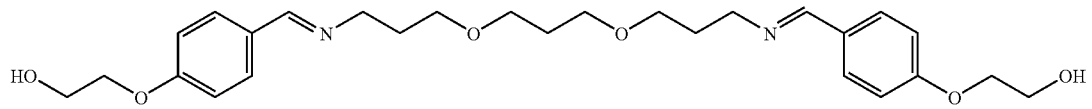 (B-26)
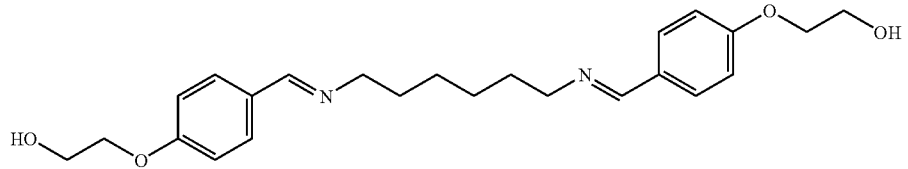 (B-27)
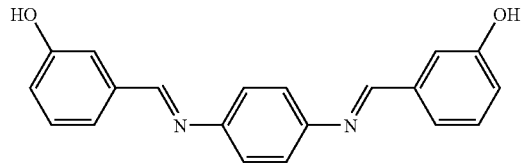 (B-28)
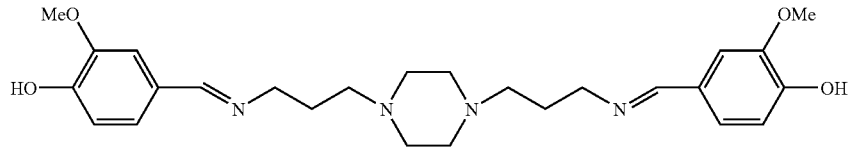 (B-29)

-continued
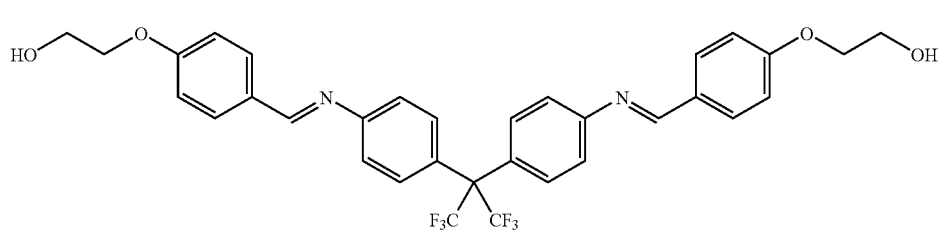
(B-30)
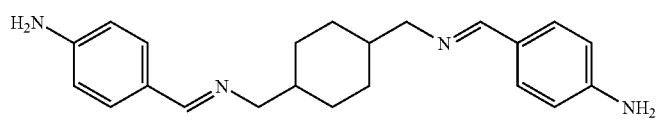
(B-31)
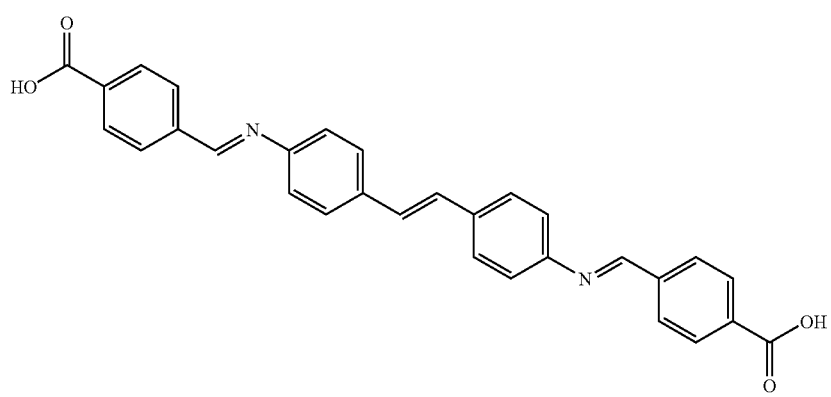
(B-32)
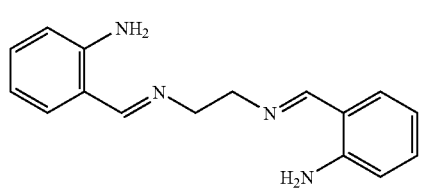
(B-33)
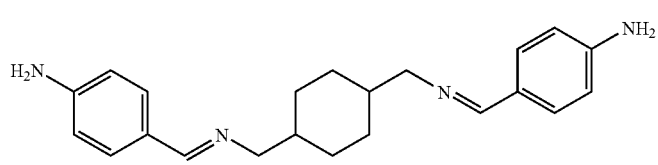
(B-34)
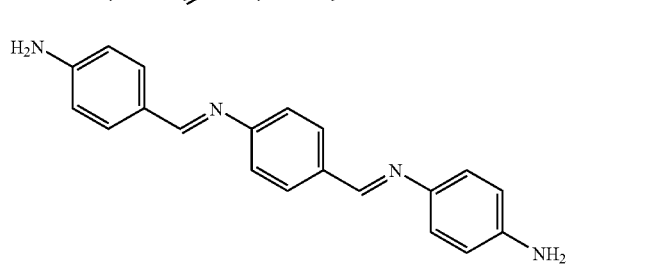
(B-35)
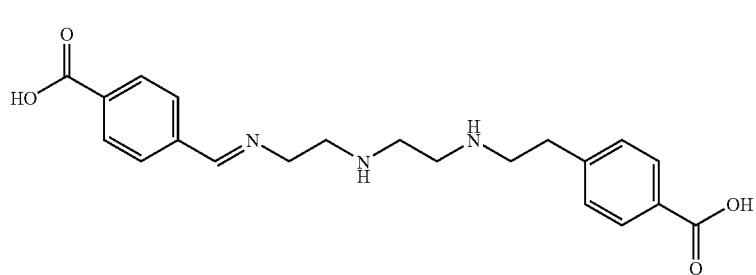
(B-36)

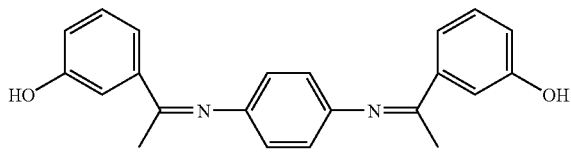
(B-37)

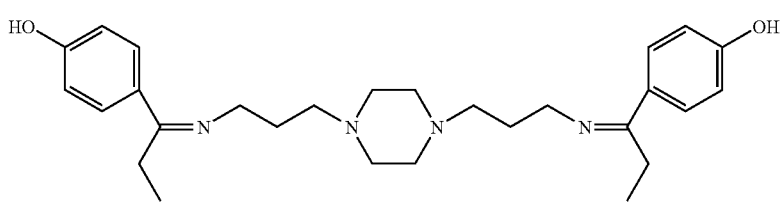
(B-38)

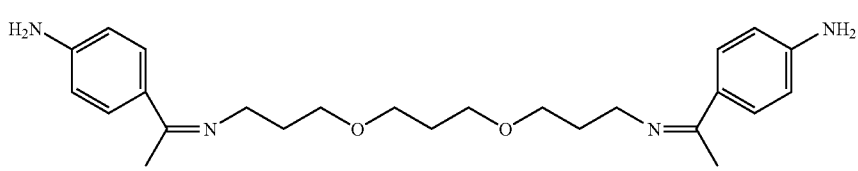
(B-39)

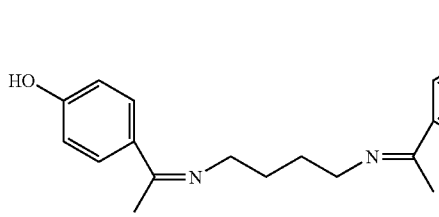
(B-40)

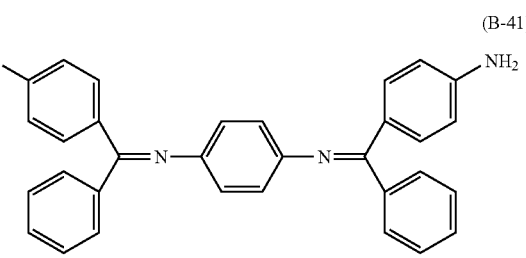
(B-41)

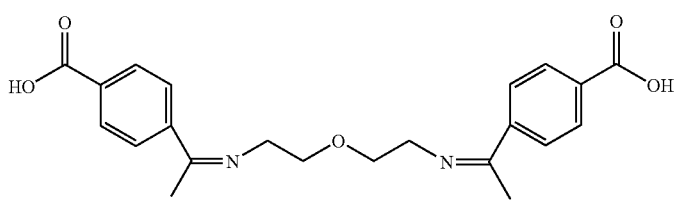
(B-42)

A synthesis example of the compound represented by formula (2) for use in the present invention is described below.

<Synthesis of Compound (B-13)>

In a 300 mL-volume Kjeldahl flask, 15.05 g of 2-(4-aminophenyl)ethyl alcohol, 100 mL of ethanol and 7.00 g of terephthalaldehyde were added and stirred for 1 hour at room temperature. The obtained yellow powder was separated by filtration, washed with 100 mL of ethanol and dried in a vacuum state to obtain 18.20 g of (B-13). This is conformed to be the objective compound from NMR spectrum, IR spectrum and mass analysis spectrum.

The polymer compound obtained by polymerizing a compound represented by formula (2) as at least one polymerization component includes a compound obtained by the polycondensation or polyaddition reaction of a compound represented by formula (2) and a bifunctional compound capable of reacting with the compound of formula (2). This polymer compound may be any polymer compound, but preferred examples thereof include polyesters, polyamides and polyethers obtained by a polycondensation reaction, and polyureas and polyurethanes obtained by a polyaddition reaction. In view of physical properties of the polymer obtained, polyurethanes are more preferred. As for the bifunctional compound used in the reaction, a diamine compound, a dicarboxylic acid or a derivative thereof, a diisocyanate compound and a diol compound are preferred similarly to that used for the production of a polymer compound obtained by polymerizing a compound represented by formula (1) as a polymerization component.

Specific examples of the polymer compound obtained by polymerizing a compound represented by formula (2) as at least one polymerization component are set forth below, but the present invention is not limited thereto.

Incidentally, in the present invention, from the standpoint of engraving sensitivity and stability, the polymerization unit obtained from the compound represented by formula (2) is preferably contained in the polymer in an amount of 1 to 80 mass %, more preferably from 10 to 60 mass %.

| | | Molecular Weight |
|---|---|---|
| $P_B$-1 | HOCO—⟨C$_6$H$_4$⟩—CO$_2$H (B-7) 50/50 | 19,000 |
| $P_B$-2 | HOCO—⟨C$_6$H$_4$⟩—CO$_2$H (B-8) 50/50 | 15,000 |
| $P_B$-3 | HOCO—⟨C$_6$H$_4$⟩—CO$_2$H (B-18) 50/50 | 17,000 |
| $P_B$-4 | HOCO—⟨C$_6$H$_4$⟩—CO$_2$H (B-22) 50/50 | 14,000 |
| $P_B$-5 | HOCO—⟨C$_6$H$_4$⟩—CO$_2$H (B-39) 50/50 | 19,000 |
| $P_B$-6 | H$_2$N—(CH$_2$)$_4$—NH$_2$ (B-9) 50/50 | 20,000 |
| $P_B$-7 | H$_2$N—⟨C$_6$H$_4$⟩—NH$_2$ (B-10) 50/50 | 21,000 |
| $P_B$-8 | H$_2$N—CH$_2$CH$_2$—O—CH$_2$CH$_2$—O—CH$_2$CH$_2$—NH$_2$ (B-42) 50/50 | 25,000 |
| $P_B$-9 | HOCO—⟨C$_6$H$_4$⟩—CO$_2$H (B-2) 50/50 | 30,000 |
| $P_B$-10 | HOCO—⟨C$_6$H$_4$⟩—CO$_2$H (B-4) 50/50 | 25,000 |
| $P_B$-11 | HOCO—(CH$_2$)$_4$—CO$_2$H (B-13) 50/50 | 27,000 |
| $P_B$-12 | HOCO—(CH$_2$)$_4$—CO$_2$H (B-28) 50/50 | 32,000 |

-continued

| | | Molecular Weight |
|---|---|---|
| P_B-13 | HOCO—[cyclohexane]—CO₂H (B-40) 50 / 50 | 30,000 |
| P_B-14 | TEG 50 / (B-24) 50 | 22,000 |
| P_B-15 | HO—[C₆H₄]—C(CH₃)₂—[C₆H₄]—OH 50 / (B-25) 50 | 35,000 |
| P_B-16 | HOCO—[benzene]—CO₂H (B-1) 50 / 50 | 20,000 |
| P_B-17 | MDI 50 / (B-2) 50 | 30,000 |
| P_B-18 | MDI 50 / TEG 30 / (B-3) 20 | 40,000 |
| P_B-19 | MDI 50 / DEG 30 / (B-4) 20 | 35,000 |
| P_B-20 | OCN—[cyclohexane]—CH₂—[cyclohexane]—NCO 50 / DEG 10 / (B-12) 40 | 19,000 |
| P_B-21 | TDI 50 / (B-16) 50 | 21,000 |
| P_B-22 | TDI 50 / (B-26) 50 | 30,000 |
| P_B-23 | TDI 50 / (B-28) 50 | 29,000 |
| P_B-24 | MDI 50 / (B-30) 50 | 30,000 |
| P_B-25 | MDI 50 / (B-37) 50 | 20,000 |
| P_B-26 | MDI 30 / HMDI 20 / PEG Mw = 1000 5 / HO—(CH₂)₅—OH 20 / (B-2) 25 | 30,000 |
| P_B-27 | MDI 30 / HMDI 20 / PEG Mw = 1000 5 / HO—(CH₂)₆—OH 20 / (B-4) 25 | 31,000 |
| P_B-28 | MDI 30 / HMDI 20 / PEG Mw = 1000 5 / HO—(CH₂)₆—OH 20 / (B-5) 25 | 25,000 |
| P_B-29 | MDI 30 / HMDI 20 / PEG Mw = 1000 5 / HO—(CH₂)₅—OH 20 / (B-12) 25 | 32,000 |
| P_B-30 | MDI 30 / HMDI 20 / PEG Mw = 1000 5 / HO—(CH₂)₆—OH 20 / (B-13) 25 | 28,000 |
| P_B-31 | MDI 30 / HMDI 20 / PEG Mw = 1000 5 / HO—(CH₂)₅—OH 20 / (B-27) 25 | 29,000 |

-continued

| | | | | | | | Molecular Weight |
|---|---|---|---|---|---|---|---|
| $P_B$-32 | MDI 30 | HMDI 20 | PEG Mw = 1000 5 | HO~~~~~OH 20 | (B-28) 25 | | 37,000 |
| $P_B$-33 | MDI 30 | HMDI 20 | PEG Mw = 1000 5 | HO~~~~~OH 20 | (B-37) 25 | | 30,000 |
| $P_B$-34 | MDI 30 | HMDI 20 | PEG Mw = 1000 5 | HO~~~~~OH 20 | (B-40) 25 | | 30,000 |
| $P_B$-35 | TDI 50 | (B-6) 50 | | | | | 31,000 |
| $P_B$-36 | TDI 50 | (B-8) 50 | | | | | 31,000 |
| $P_B$-37 | MDI 30 | HMDI 20 | (B-22) 50 | | | | 28,000 |
| $P_B$-38 | MDI 30 | HMDI 20 | (B-33) 50 | | | | 38,000 |
| $P_B$-39 | MDI 30 | HMDI 20 | (B-39) 50 | | | | 37,000 |
| $P_B$-40 | MDI 30 | HMDI 20 | (B-1) 50 | | | | 20,000 |
| $P_B$-41 | MDI 30 | HMDI 20 | (B-11) 50 | | | | 22,000 |

In the Tables above, the numerical value below the compound is mol %, and the molecular weight is the mass average molecular weight.

<Synthesis of Compound (PB-30)>

In a 300 mL-volume three-neck flask, 70 mL of N-methyl-2-pyrrolidinone, 9.31 g of (B-13), 5.00 g of polyethylene glycol (molecular weight: 1,000), 2.36 g of hexamethylene glycol, 3.36 g of hexamethylene diisocyanate and 7.50 g of 4,4'-methyldiphenyl diisocyanate were added and heated with stirring at 50° C. until the solid matters were completely dissolved in the solvent. After adding two drops of NEO-STANN produced by Nitto Kasei Co., Ltd.), the solution was further heated with stirring at 70° C. for 5 hours. Subsequently, 3 mL of methanol was added thereto and the resulting reaction solution was further heated with stirring at 50° C. for 1 hour. The obtained reaction solution was cooled to room temperature and then poured in 3 L of water to obtain 25.5 g of white powder. This compound was confirmed to be the objective compound from NMR spectrum, IR spectrum and GPC.

In the present invention, the polymer compound containing a structure represented by formula (0) as a repeating unit in the main chain, the polymer compound obtained by polymerizing a compound represented by formula (1) as at least one polymerization component, and the polymer compound obtained by polymerizing a compound represented by formula (2) as at least one polymerization component each may be used alone or may be used in combination of a plurality of species. Furthermore, these polymer compounds each may be used as a mixture by adding thereto one or more kinds of conventionally known polymer binders (added polymer binder) which are described later. In the case of using the polymer compound as a mixture, the added polymer binder is used in an amount of 1 to 60 mass %, preferably from 1 to 40 mass %, more preferably from 1 to 20 mass %, based on the total mass of the polymer binder components.

In view of laser decomposability, stability and printing durability, the mass average molecular weight of the polymer compound is preferably from 5,000 to 500,000, more preferably from 8,000 to 300,000, and most preferably from 10,000 to 150,000.

Also, in the present invention, from the standpoint of sensitivity, a compound having at least one structure represented by formula (0), preferably a crosslinking agent having at least three structures represented by formula (0), may be contained as a crosslinking agent or an additive.

(Photolatent or Heat-Latent Catalyst)

The photo-latent or heat-latent catalyst as used in the present invention indicates a group of compounds in which an active acidic group, basic group or radical is temporarily restrained by chemical means such as blocking and which can be converted into a compound again exhibiting activity by cleaving the active group or radical upon light irradiation or under heating. Among these compounds, a compound capable of generating an acid, a compound capable of generating a base, and a compound capable of generating a radical are preferred, and a compound capable of generating an acid is more preferred in view of sensitivity.

<Compound Capable of Generating Acid>

The acid generator used in the present invention is preferably a compound which generates an acid by the effect of heat, and examples thereof include the compounds described in JP-A-10-282644 (paragraphs [0039] to [0063]).

Specific examples thereof include onium salts such as diazonium salts described in S. I. Schlesinger, Photogr. Sci. Eng., 18, 387 (1974), T. S. Bal et al., Polymer, 21, 423 (1980), etc., ammonium salts described in U.S. Pat. Nos. 4,069,055 and 4,069,056, JP-A-3-140140, etc., phosphonium salts described in D. C. Necker et al., Macromolecules, 17, 2468 (1984), C. S. Wen et al., Teh, Proc. Conf. Rad. Curing ASIA, page 478, Tokyo, October (1988), U.S. Pat. Nos. 4,069,055 and 4,069,056, etc., iodonium salts described in J. V. Crivello et al., Macromolecules, 10 (6) 1307 (1977), Chem. & Eng. News, November 28, page 31 (1988), European Patent 104, 143, U.S. Pat. Nos. 339,049 and 410,201, JP-A-2-150848, JP-A-2-296514, etc., sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patent 370,693, U.S. Pat. No. 3,902,114, European Patents 233,567, 297,443 and 297,442, U.S. Pat. Nos. 4,933,377, 410,201, 339,049, 4,760,013, 4,734,444 and 2,833,827, German Patents 2,904,626, 3,604,580 and 3,604,581, etc., selenonium salts described in J. V. Crivello et al., Macromolecules, 10 (6), 1307 (1977), J. V. Crivello et al., J. Polymer Sci., Polymer Chem. Ed., 17, 1047 (1979), etc., and arsonium salts described in C. S. Wen et al., Teh, Proc. Conf. Rad. Curing ASIA, page 478, Tokyo, October (1988), etc.; organohalogen compounds described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, JP-A-63-298339, etc.; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896), JP-A-2-161445, etc.; photoacid generators having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol, 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patents 0,290,750, 046,083, 156,535, 271,851 and 0,388,343, U.S. Pat. Nos. 3,901,710 and 4,181,531, JP-A-60-198538, JP-A-53-133022, etc.; compounds capable of generating a sulfonic acid resulting from decomposition, as represented by iminosulfonate and the like, described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 199,672, 044,115 and 0,101,122, U.S. Pat. Nos. 4,618,564, 4,371,605 and 4,431,774, JP-A-64-18143, JP-A-2-245756, JP-A-4-365048, etc.; disulfone compounds described in JP-A-61-166544, etc.; o-naphthoquinonediazide-4-sulfonic acid halides described in JP-A-50-36209 (corresponding to U.S. Pat. No. 3,969,118); and o-naphthoquinonediazide compounds described in JP-A-55-62444 (corresponding to British Patent 2,038,801) and JP-B-1-11935.

Other examples of the acid generator which can be used include cyclohexyl citrate, a sulfonic acid alkyl ester such as cyclohexyl p-acetaminobenzenesulfonate and cyclohexyl p-bromobenzenesulfonate, and alkylsulfonic acid esters represented by the following structural formulae:

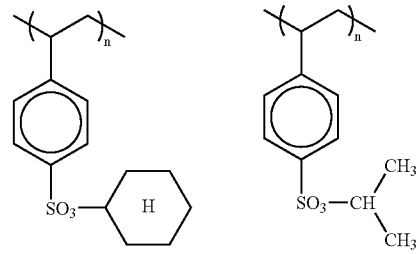

Of these acid generators, particularly effective compounds are described below.

(1) Oxazole derivative represented by the following formula (PAG1) and S-triazine derivative represented by formula (PAG2), each substituted by trihalomethyl group:

(PAG1)

(PAG2)

wherein $R^1$ represents a substituted or unsubstituted aryl or alkenyl group, $R^2$ represents a substituted or unsubstituted aryl, alkenyl or alkyl group or $-CY_3$, and Y represents a chlorine atom or a bromine atom.

Specific examples thereof include, but are not limited to, the following compounds.

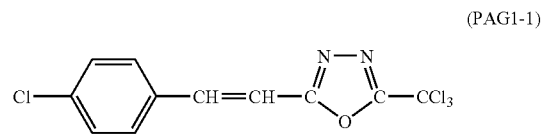

(PAG1-1)

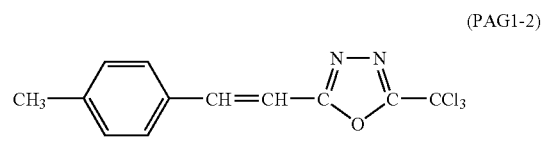

(PAG1-2)

(PAG2-1)

-continued

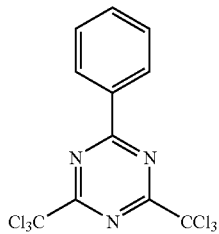
(PAG2-2)

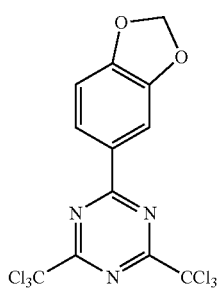
(PAG2-3)

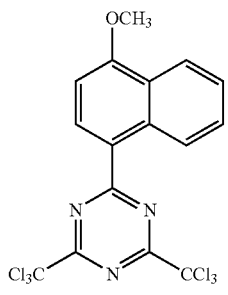
(PAG2-4)

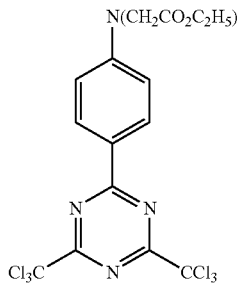
(PAG2-5)

(2) Iodonium salt represented by the following formula (PAG3), and sulfonium salt or diasonium salt represented by formula (PAG4):

(PAG3)

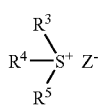
(PAG4)

In these formulae, $Ar^1$ and $Ar^2$ each independently represents a substituted or unsubstituted aryl group. Preferred examples of the substituent include an alkyl group, a haloalkyl group, a cycloalkyl group, an aryl group, an alkoxy group, a nitro group, a carboxyl group, an alkoxycarbonyl group, a hydroxy group, a mercapto group and a halogen atom.

$R^3$, $R^4$ and $R^5$ each independently represents a substituted or unsubstituted alkyl or aryl group, preferably an aryl group having a carbon number of 6 to 14, an alkyl group having a carbon number of 1 to 8, or a substitution derivative thereof. Preferred examples of the substituent for the aryl group include an alkoxy group having a carbon number of 1 to 8, an alkyl group having a carbon number of 1 to 8, a nitro group, a carboxyl group, a hydroxy group and a halogen atom, and preferred examples of the substituent for the alkyl group include an alkoxy group having a carbon number of 1 to 8, a carboxyl group and an alkoxycarbonyl group. Two members out of $R^3$, $R^4$ and $R^5$, or $Ar^1$ and $Ar^2$ may combine through a single bond or a substituent $Z^-$ represents a counter anion, and examples thereof include, but are not limited to, $BF_4^-$, $AsF_6^-$, $PF_6^-$, $SbF_6^-$, $SiF_6^{2-}$, $ClO_4^-$, perfluoroalkanesulfonate anion (e.g., $CF_3SO_3^-$, $C_4F_9SO_3^-$), pentafluorobenzenesulfonate anion, bonded polynuclear aromatic sulfonate anion (e.g., naphthalene-1-sulfonate anion), anthraquinonesulfonate anion and sulfonic acid group-containing dye.

Specific examples of these onium salts include, but are not limited to, the following compounds.

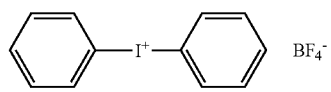
(PAG3-1)

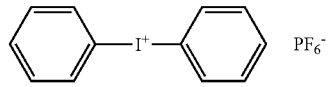
(PAG3-2)

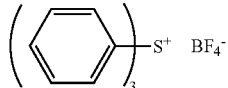
(PAG4-1)

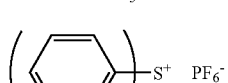
(PAG4-2)

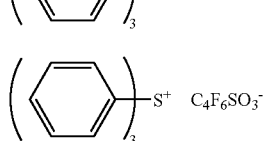
(PAG4-3)

The above-described onium salts represented by formulae (PAG3) and (PAG4) are known and can be synthesized by the method described, for example, in J. W. Knapczyk et al., J. Am. Chem. Soc., 91, 145 (1969), A. L. Maycok et al., J. Org. Chem., 35, 2532 (1970), B. Goethas et al., Bull. Soc. Chem. Belg., 73, 546 (1964), H. M. Leicester, J. Am. Chem. Soc., 51, 3587 (1929), J. V. Crivello et al., S. Polym. Chem. Ed., 18, 2677 (1980), U.S. Pat. Nos. 2,807,648 and 4,247,473, and JP-A-53-101331.

(3) Disulfone derivative represented by the following formula (PAG5) and iminosulfonate derivative represented by formula (PAG6):

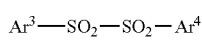
(PAG5)

(PAG6)

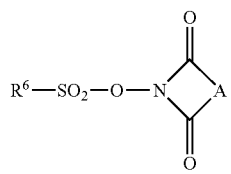

(PAG6-2)

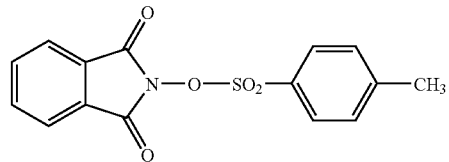

In these formulae, $Ar^3$ and $Ar^4$ each independently represents a substituted or unsubstituted aryl group, $R^6$ represents a substituted or unsubstituted alkyl or aryl group, and A represents a substituted or unsubstituted alkylene, alkenylene or arylene group.

Specific examples thereof include, but are not limited to, the following compounds.

(PAG5-1)

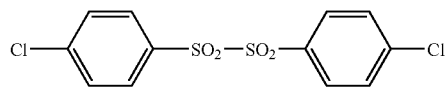

(PAG5-2)

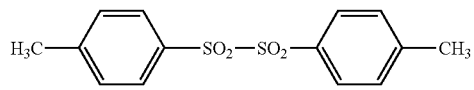

(PAG6-1)

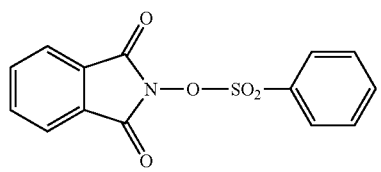

The amount of the acid generator used is usually from 0.1 to 50 mass %, preferably from 1 to 40 mass %, based on the entire solid content in the composition. Within this range, high sensitivity and good stability are obtained.

<Compound Capable of Generating Base>

As for the base generator used in the invention, compounds described in JP-A-2-166450, page 6, from upper left column, line 2 to upper right column, line 15 may be preferably used. Specifically, a compound capable of causing some reaction when heated and resultantly releasing a base is preferred, and examples thereof include a salt of an organic acid with a base, which undergoes decarboxylation when heated, and a compound which releases amines as a result of a reaction such as intramolecular nucleophilic substitution reaction, Lossen rearrangement and Beckmann rearrangement.

Specifically, an acid salt of a base may be used. Examples of the base include guanidine, triphenylguanidine, tricyclohexylguanidine, piperidine, morpholine, p-toluidine and 2-picoline, and examples of the acid include acetic acid, trichloroacetic acid, phenylsulfonylacetic acid, 4-methylsulfonylphenylsulfonylacetic acid, 4-acetylamino-methylpropionic acid, oxalic acid, maleic acid, succinic acid, fumaric acid, carbonic acid and bicarbonic acid.

The base generator may be introduced into the layer as a particulate material by directly dispersing the solid base generator in the composition or may be introduced in the state of being encapsulated in a microcapsule which is described later.

Specific examples of the base generator include, but are not limited to, the compounds shown below.

B-1

B-2

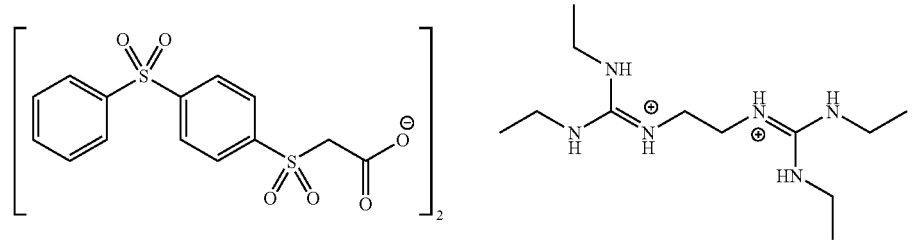

B-3

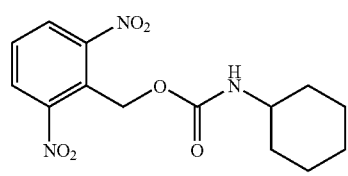

-continued

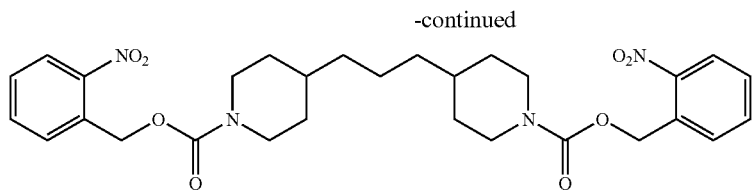
B-4

The amount of the base generator added is usually from 0.1 to 50 mass %, more preferably from 1 to 40 mass %, based on the entire solid content in the composition. Within this range, high sensitivity and good stability are obtained.

<Compound Capable of Generating Radical>

The radical generator for use in the present invention may be appropriately selected from known polymerization initiators or compounds having a bond with small bond dissociation energy. Two or more kinds of compounds capable of generating a radical may be used in combination.

The compound capable of generating a radial is described in JP-A-2004-306582. Examples of the compound capable of generating a radical include a halogenated organic compound, a carbonyl compound, an organic peroxide, an azo-based polymerization initiator, an azide compound, a metallocene compound, a hexaarylbiimidazole compound, an organoboric compound, a disulfonic compound, an oxime ester compound and an oxime salt compound. A hexaarylbiimidazole compound and an onium salt are most preferred.

Specific examples thereof include, but are not limited to, the compounds shown below.

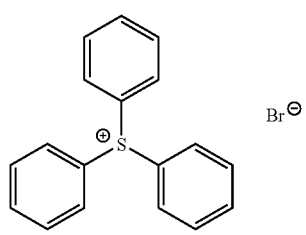
R-1

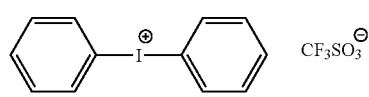
R-2

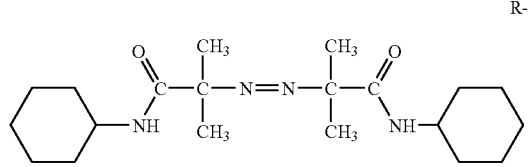
R-3

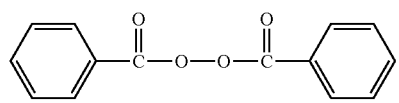
R-4

-continued

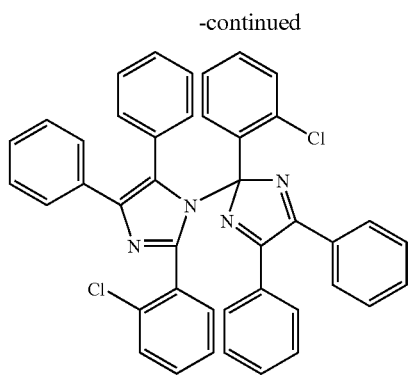
R-5

The amount of the radical generator added is usually from 0.1 to 50 mass %, preferably from 1 to 40 mass %, based on the entire solid content in the composition. Within this range, high sensitivity and good stability are obtained.

(Added Polymer Binder)

The added polymer binder is preferably a readily liquefiable resin or a readily decomposable resin. The readily decomposable resin preferably contains in its molecular chain a readily decomposable monomer unit such as styrene, α-methylstyrene, α-methoxystyrene, acryl esters, methacryl esters, ester compounds, ether compounds, nitro compounds, carbonate compounds, carbamoyl compounds, hemiacetal ester compounds, oxyethylene compounds and aliphatic cyclic compounds. In particular, representative examples of the readily decomposable resin are polyethers such as polyethylene glycol, polypropylene glycol and polytetraethylene glycol, aliphatic polycarbonates, aliphatic carbamates, and polymers having a molecular structure such as polymethyl methacrylate, polystyrene, nitrocellulose, polyoxyethylene, polynorbornene, hydrated polycyclohexadiene and dendrimer with many branched structures. Also, a polymer containing many oxygen atoms in the molecular chain is preferred in view of decomposability. Out of these, a compound containing a carbonate group, a carbamate group or a methacryl group in the polymer main chain is preferred because of high thermal decomposability. For example, a polyester or polyurethane synthesized starting from a polycarbonate diol or a polycarbonate dicarboxylic acid, and a polyamide synthesized starting from a polycarbonate diamine, are a polymer assured of good thermal decomposability. These polymers may contain a polymerizable unsaturated group in the main chain or side chain thereof. Particularly, in the case of having a reactive functional group such as hydroxyl group, amino group and carboxyl group, a polymerizable unsaturated group can be easily introduced.

Also, the added polymer binder is preferably a polymer compound having elastomericity. The polymer having elastomericity is not particularly limited, but examples thereof include a urethane-based elastomer, an ester-based elastomer, an amide-based elastomer and a silicone-based elastomer. In order to more enhance the thermal decomposability, there may be also used a polymer where an easily decomposable functional group having high decomposability, such as carbamoyl group and carbonate group, is introduced into the main chain. The polymer may be mixed with a polymer having higher thermal decomposability. The thermoplastic elastomer is fluidized when heated and therefore, can be successfully mixed with a composite for use in the present invention. The molecular structure thereof comprises a soft segment like a polyether or rubber molecule, and a hard segment which prevents plastic deformation around ordinary temperature similarly to vulcanized rubber. As for the hard segment, there are present various types such as frozen layer, crystalline layer, hydrogen bonding and ionic bonding.

The kind of the elastomer can be selected according to usage of the resin composition. For example, urethane-based, ester-based, amide-based and fluorine-based elastomers are preferred in the field requiring solvent resistance, and urethane-based, olefin-based, ester-based and fluorine-based elastomers are preferred in the field requiring heat resistance. Also, the hardness can be varied by the kind of the elastomer.

Among these added polymer binders, an added polymer binder having a carbon-carbon unsaturated bond at least in either the main chain or the side chain is preferred, a polymer containing at least either an olefin (carbon-carbon double bond) or a carbon-carbon triple bond in the main chain is more preferred in view of high mechanical strength of the film formed, and a polymer containing an olefin in the main chain is still more preferred.

Examples of the polymer containing at least either an olefin or a carbon-carbon triple bond in the main chain include SB (styrene-butadiene), SBS (styrene-butadiene-styrene), SIS (styrene-isoprene-styrene) and SEBS (styrene-polyethylene/polybutylene-styrene).

The number average molecular weight of the added polymer binder is preferably from 1,000 to 1,000,000, more preferably from 5,000 to 500,000. When the number average molecular weight is from 1,000 to 1,000,000, mechanical strength of the film formed can be ensured. The number average molecular weight as used herein is a value measured by gel permeation chromatography (GPC) and evaluated with respect to a polystyrene preparation of which molecular weight is known.

(Microcapsule)

In the present invention, as for the method of incorporating the above-described photosensitive layer constituent components and other constituent components into the photosensitive layer, the constituent components may be partially encapsulated in a microcapsule and added to the photosensitive layer as described, for example, in JP-A-2001-277740 and JP-A-2001-277742. In this case, each constituent component may be incorporated into the inside and the outside of a microcapsule at an arbitrary ratio.

For microencapsulating the constituent components of the photosensitive layer, known methods can be applied. Examples of the method for producing a microcapsule include, but are not limited to, a method utilizing coacervation described in U.S. Pat. Nos. 2,800,457 and 2,800,458, a method utilizing interfacial polymerization described in U.S. Pat. No. 3,287,154, JP-B-38-19574 and JP-B-42-446, a method utilizing polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall-forming material described in U.S. Pat. Nos. 4,001,140, 4,087,376 and 4,089,802, a method using a wall material such as melamine-formaldehyde resin and hydroxy cellulose described in U.S. Pat. No. 4,025,445, an in situ method utilizing monomer polymerization described in JP-B-36-9163 and JP-B-51-9079, a spray drying method described in British Patent 930,422 and U.S. Pat. No. 3,111,407, and an electrolytic dispersion cooling method described in British Patents 952,807 and 967,074.

The microcapsule wall for use in the present invention preferably has a three-dimensionally crosslinked structure and has a property of swelling with a solvent. From this standpoint, the wall material of the microcapsule is preferably polyurea, polyurethane, polyester, polycarbonate, polyamide or a mixture thereof, more preferably polyurea or polyurethane. Also, a compound having a crosslinking functional group such as ethylenically unsaturated bond, which can be introduced into the above-described water-insoluble polymer, may be introduced into the microcapsule wall.

The average particle diameter of the microcapsule is preferably from 0.01 to 3.0 µm, more preferably from 0.05 to 2.0 µm, still more preferably from 0.10 to 1.0 µm. Within this range, high resolution and good aging stability are obtained, (Other Components)

in the composition of the present invention, other components suitable for usage, production method and the like may be further appropriately added. Examples of such an additive are described below.

Polymerizable Unsaturated Double Bond-Containing Compound:

The composition of the present invention preferably contains a polymerizable unsaturated double bond-containing compound (hereinafter referred to as a polymerizable compound or monomer). This is described in detail below by referring to the case using an addition-polymerizable compound as the polymerizable compound (monomer).

<Addition-Polymerizable Compound>

The addition-polymerizable compound having at least one ethylenically unsaturated double bond, which is a preferred polymerizable compound for use in the present invention, is selected from compounds having at least one, preferably two or more, terminal ethylenically unsaturated bond(s). Such compounds are widely known in this industrial field and these known compounds can be used in the present invention without any particular limitation. These compounds have a chemical mode such as a monomer, a prepolymer (that is, a dimer, a trimer or an oligomer), a copolymer of these, or a mixture thereof. Examples of the monomer include an unsaturated carboxylic acid (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, an addition reaction product of an unsaturated carboxylic acid ester or amide having a nucleophilic substituent such as hydroxyl group, amino group or mercapto group with a monofunctional or polyfunctional isocyanate or epoxy, and a dehydrating condensation reaction product with a monofunctional or polyfunctional carboxylic acid may be suitably used. Furthermore, an addition reaction product of an unsaturated carboxylic acid ester or amide having an electrophilic substituent such as isocyanate group or epoxy group with a monofunctional or polyfunctional alcohol, amine or thiol, and a displacement reaction product of an unsaturated carboxylic acid ester or amide having a desorptive substituent such as halogen group or tosyloxy group with a monofunctional or polyfunctional alcohol, amine or thiol may also be suitably used. In addition, compounds where the above-described unsaturated carboxylic acid is replaced by an unsaturated phosphonic acid, styrene, vinyl ether or the like, may also be used.

Specific examples of the ester monomer of an aliphatic polyhydric alcohol compound with an unsaturated carboxylic acid include the followings. Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomer.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerytritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane and bis[p-(methacryloxyethoxy) phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate.

Examples of the crotonic acid ester include ethylene glycol dicrotonate, tetramethylene glycol dicrotonate, pentaerythritol dicrotonate and sorbitol tetradicrotonate.

Examples of the isocrotonic acid ester include ethylene glycol diisocrotonate, pentaerythritol diisocrotonate and sorbitol tetraisocrotonate.

Examples of the maleic acid ester include ethylene glycol dimaleate, triethylene glycol dimaleate, pentaerythritol dimaleate and sorbitol tetramaleate.

Other examples of the ester which can be suitably used include aliphatic alcohol-based esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613.

These ester monomers may also be used as a mixture.

Specific examples of the amide monomer of an aliphatic polyvalent amine compound with an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Other preferred examples of the amide-based monomer include those having a cyclohexylene structure described in JP-B-54-21726.

A urethane-based addition-polymerizable compound produced using an addition reaction of an isocyanate with a hydroxyl group is also suitably used, and specific examples thereof include a vinyl urethane compound having two or more polymerizable vinyl groups within one molecule described in JP-B-48-41708, which is obtained by adding a hydroxyl group-containing vinyl monomer represented by the following formula (V) to a polyisocyanate compound having two or more isocyanate groups within one molecule.

$$CH_2=C(R)COOCH_2CH(R')OH \qquad (V)$$

(wherein R and R' each represents H or $CH_3$).

In addition, urethane acrylates described in JP-A-51-37193, JP-B-2-32293 and JP-B-2-16765, and urethane compounds having an ethylene oxide-based skeleton described in JP-B-58-49860, JP-B-56-17654, JP-B-62-39417 and JP-B-62-39418 are also suitably used.

Furthermore, when addition-polymerizable compounds having an amino or sulfide structure within the molecule described in JP-A-63-277653, JP-A-63-260909 and JP-A-1-105238 are used, a cured composition can be obtained in a short time.

Other examples include a polyfunctional acrylate or methacrylate such as polyester acrylates described in JP-A-48-64183, JP-B-49-43191 and JP-B-52-30490 and epoxy acrylates obtained by reacting an epoxy resin with a (meth)acrylic acid. Also, a specific unsaturated compound described in JP-B-46-43946, JP-B-1-40337 and JP-B-140336, a vinyl phosphonic acid-based compound described in JP-A-2-25493, or the like may be used. In some cases, a structure containing a perfluoroalkyl group described in JP-A-61-22048 is suitably used. Furthermore, those described as a photocurable monomer or oligomer in Adhesion, Vol. 20, No. 7, pp. 300-308 (1984) may also be used.

In view of photosensitive speed, a structure having a large unsaturated group content per one molecule is preferred and in most cases, a bifunctional or greater functional compound is preferred. For increasing the strength of the image area, namely, cured layer, a trifunctional or greater functional compound is preferred. Also, a method of controlling both photosensitivity and strength by using a combination of compounds differing in the functional number or differing in the polymerizable group (for example, an acrylic acid ester, a methacrylic acid ester, a styrene-based compound and a vinyl ether-based compound) is effective. The addition-polymerizable compound is preferably used in an amount of 5 to 80 mass %, more preferably from 25 to 75 mass %, based on the nonvolatile components in the composition. Also, one of these compounds may be used alone, or two or more thereof may be used in combination.

Before and/or after laser decomposition, the laser-decomposable resin composition containing the polymerizable compound can be polymerized and cured by an energy such as light and heat.

Initiator:

As for the initiator, those known to one skilled in the art can be used without limitation. Specifically, many compounds are described, for example, in Bruce M. Monroe et al., Chemical Revue, 93, 435 (1993); R. S. Davidson, Journal of Photochemistry and Biology A: Chemistry, 73, 81 (1993); J. P. Faussier, "Photoinitiated Polymerization-Theory and Applications" of Rapra Review, Vol. 9, Report, Rapra Technology (1998); and M. Tsunooka et al., Prog. Polym. Sci., 21, 1 (1996). There are also known a group of compounds which undergo oxidative or reductive bond cleavage, such as those described in F. D. Saeva, Topics in Current Chemistry, 156, 59 (1990); G. G. Maslak, Topics in Current Chemistry, 168, 1

(1993); H. B. Shuster et al., JACS, 112, 6329 (1990); and I. D. F. Eaton et al., JACS, 102, 3298 (1980).

In regard to specific preferred examples of the initiator, a radical initiator which is a compound capable of generating a radical by an energy of light and/or heat and initiating or accelerating a polymerization reaction of the above-described polymerizable compound is described in detail below, but the present invention is not limited by the following description.

Preferred examples of the radical initiator for use in the present invention include (a) aromatic ketones, (b) an onium salt compound, (c) an organic peroxide, (d) a thio compound, (e) a hexaarylbiimidazole compound, (f) a ketooxime ester compound, (g) a borate compounds, (h) an azinium compound, (i) a metallocene compound, (j) an active ester compound, (k) a compound having a carbon-halogen bond, and (l) an azo-based compound. Specific examples of the compounds (a) to (l) are set forth below, but the present invention is not limited thereto.

(a) Aromatic Ketones

The (a) aromatic ketones preferred as the radical initiator for use in the present invention include compounds having a benzophenone or thioxanthone skeleton described in J. P. Fouassier and J. F. Rabek, Radiation Curing in Polymer Science and Technology, pp. 77-117 (1993). Examples thereof include the compounds shown below.

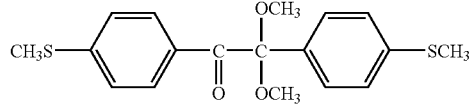

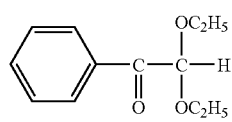

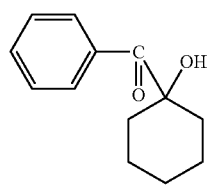

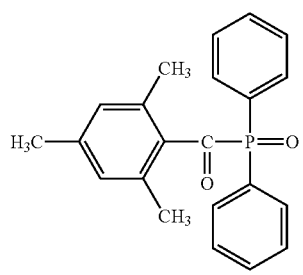

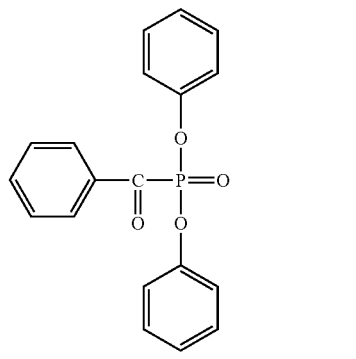

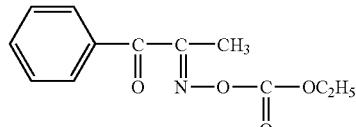

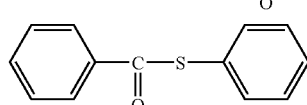

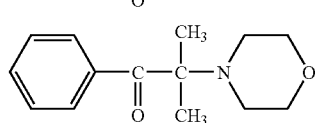

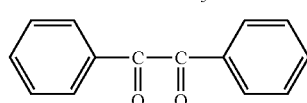

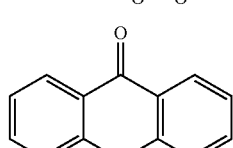

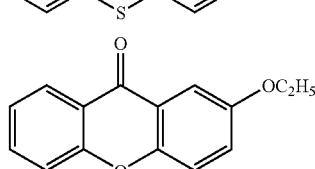

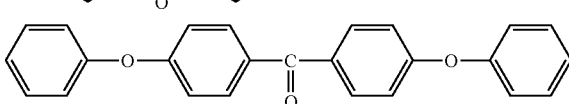

Above all, particularly preferred examples of (a) the aromatic ketones include the following compounds.

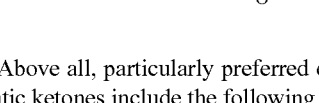

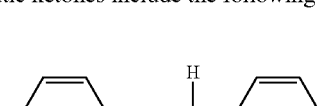

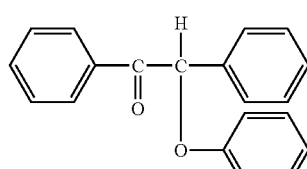

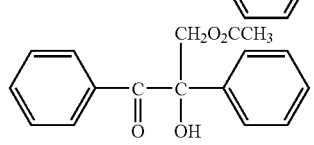

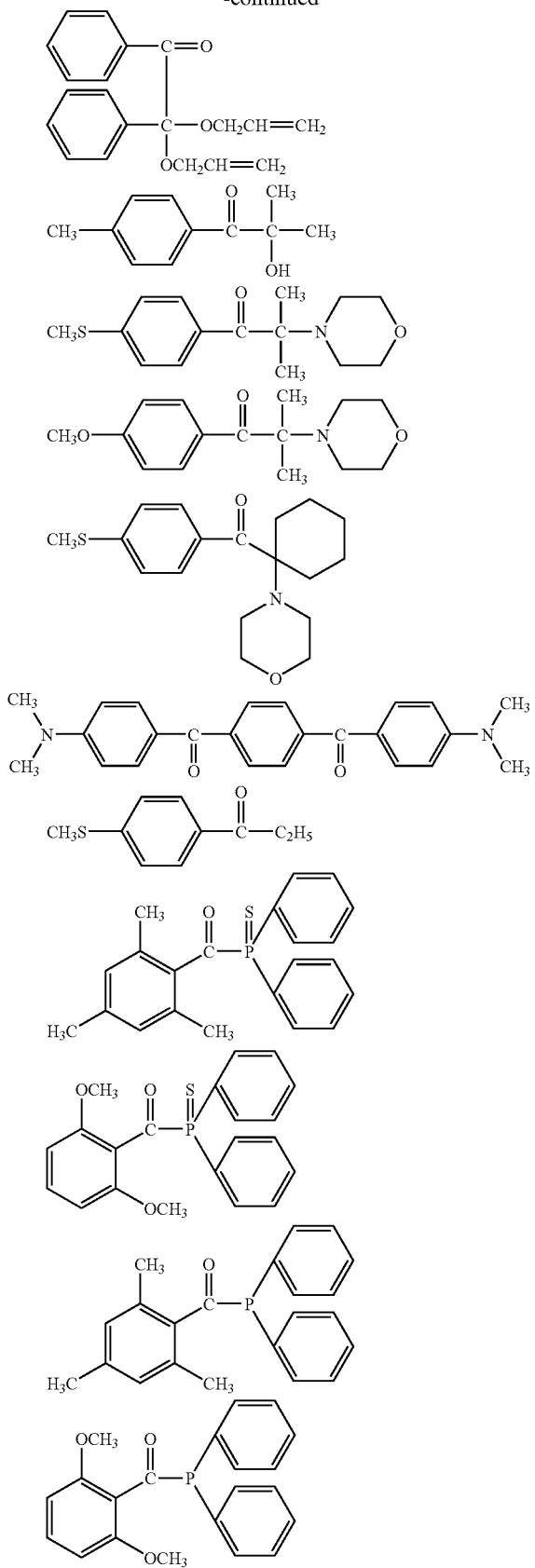

(b) Onium Salt Compound

The (b) onium salt compound preferred as the radical initiator for use in the present invention includes compounds represented by the following formulae (1) to (3).

Formula (1):

$$Ar^1\text{---}I^+\text{---}Ar^2 \quad (Z^2)^-$$

Formula (2):

$$Ar^3\text{---}N^+\equiv N \quad (Z^3)^-$$

Formula (3):

$$\begin{array}{c} R^{23} \\ \phantom{R}\diagdown \\ \phantom{RRR}S^+\text{---}R^{25} \quad (Z^4)^- \\ \phantom{R}\diagup \\ R^{24} \end{array}$$

In formula (1), $Ar^1$ and $Ar^2$ each independently represents an aryl group having a carbon number of 20 or less, which may have a substituent. $(Z^2)^-$ represents a counter ion selected from the group consisting of a halogen ion, a perchlorate ion, a carboxylate ion, a tetrafluoroborate ion, a hexafluorophosphate ion and a sulfonate ion, and is preferably a perchlorate ion, a hexafluorophosphate ion or an arylsulfonate ion.

In formula (2), $Ar^3$ represents an aryl group having a carbon number of 20 or less, which may have a substituent $(Z^3)^-$ represents a counter ion having the same meaning as $(Z^2)^-$.

In formula (3), $R^{23}$, $R^{24}$ and $R^{25}$ may be the same or different and each represents a hydrocarbon group having a carbon number of 20 or less, which may have a substituent. $(Z^4)^-$ represents a counter ion having the same meaning as $(Z^2)^-$.

Specific examples of the onium salt which can be suitably used in the present invention include those described in JP-A-2001-133969 (paragraphs [0030] to [0033]) and JP-A-2001-343742 (paragraphs [0015] to [0046]), which have been previously proposed by the present applicant, and specific aromatic sulfonium salt compounds described in JP-A-2002-148790, JP-A-2001-343742, JP-A-2002-6482, JP-A-2002-116539 and JP-A-2004-102031.

(c) Organic Peroxide

The (c) organic peroxide preferred as the radical initiator for use in the present invention includes almost all organic compounds having one or more oxygen-oxygen bonds within the molecule, and examples thereof include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis(tert-butylperoxyisopropyl)benzene, 2,5-dimethyl-2,5-di(tert-butylperoxy)hexane, 2,5-oxanoyl peroxide, succinic peroxide, benzoyl peroxide, 2,4-dichlorobenzoyl peroxide, meta-toluoyl peroxide, diisopropyl peroxydicarbonate, di-2-ethylhexyl peroxydicarbonate, di-2-ethoxyethyl peroxydicarbonate, dimethoxyisopropyl peroxycarbonate, di(3-methyl-3-methoxybutyl)peroxydicarbonate, tert-butyl peroxyacetate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tertiary carbonate, 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl) benzophenone, 3,3',4,4'-tetra-(cumylperoxycarbonyl) benzophenone, 3,3',4,4'-tetra-(p-isopropylcumylperoxycarbonyl)benzophenone, carbonyldi (tert-butylperoxy dihydrogen diphthalate) and carbonyldi (tert-hexylperoxy dihydrogen diphthalate).

Among these, preferred are peroxide esters such as 3,3',4,4'-tetra-(tert-butylperoxycarbonyl)benzophenone, 3,3',4,4'-tetra-(tert-amylperoxycarbonyl)benzophenone, 3,3',4,4'-tetra-(tert-hexylperoxycarbonyl)benzophenone, 3,3',4,4'-tetra-(tert-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-tert-butyl diperoxyisophthalate.

(d) Thio Compound

The (d) thio compound preferred as the radical initiator for use in the present invention includes compounds having a structure represented by the following formula (4):

Formula (4):

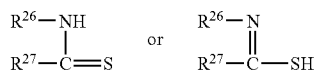

(wherein $R^{26}$ represents an alkyl group, an aryl group or a substituted aryl group, and $R^{27}$ represents a hydrogen atom or an alkyl group, or $R^{26}$ and $R^{27}$ each represents a nonmetallic atom group necessary for forming, when combined with each other, a 5- to 7-membered ring which may contain a heteroatom selected from oxygen atom, sulfur atom and nitrogen atom).

Specific examples of the thio compound represented by formula (4) include the following compounds.

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_5$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |

-continued

| No. | $R^{26}$ | $R^{27}$ |
|---|---|---|
| 31 | | —C$_6$H$_4$—NH— |
| 32 | 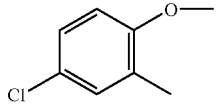 | |

(e) Hexaarylbiimidazole Compound

The (e) hexaarylbiimidazole compound preferred as the radical initiator for use in the present invention includes lophine dimers described in JP-B-45-37377 and JP-B-44-86516, such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluorophenyl)-4,4',5,5'-tetraphenylbiimidazole.

(f) Ketooxime Ester Compound

Examples of (f) the ketooxime ester compound preferred as the radical initiator for use in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(g) Borate Compound

Examples of (g) the borate compound preferred as the radical initiator for use in the present invention include a compound represented by the following formula (5):

Formula (5):

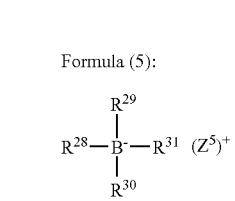

(wherein $R^{28}$, $R^{29}$, $R^{30}$ and $R^{31}$, which may be the same or different, each represents a substituted or unsubstituted alkyl group, a substituted or unsubstituted aryl group, a substituted or unsubstituted alkenyl group, a substituted or unsubstituted alkynyl group, or a substituted or unsubstituted heterocyclic group, two or more groups of $R^{28}$, $R^{29}$, $R^{30}$ and $R^{31}$ may combine to form a cyclic structure, provided that at least one of $R^{28}$, $R^{29}$, $R^{30}$ and $R^{31}$ is a substituted or unsubstituted alkyl group, and $(Z^5)^+$ represents an alkali metal cation or a quaternary ammonium cation).

Specific examples of the compound represented by formula (5) include compounds described in U.S. Pat. Nos. 3,567,453 and 4,343,891, and European Patents 109,772 and 109,773, and the following compounds.

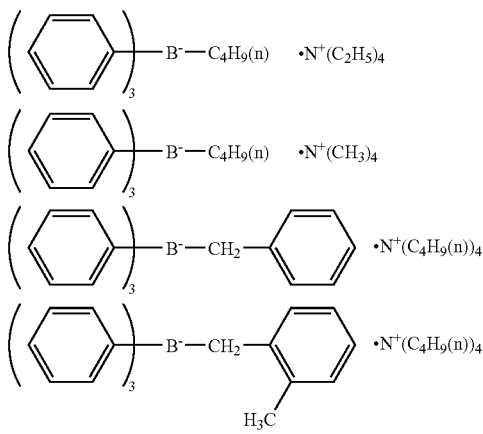

(h) Azinium Compound

The (h) azinium salt compound preferred as the radical initiator for use in the present invention includes a group of compounds having an N—O bond described in JP-A-63-138345, JP-A-63-142345, JP-A-63-142346, JP-A-63-143537 and JP-B-46-42363.

(i) Metallocene Compound

The (i) metallocene compound preferred as the radical initiator for use in the present invention includes titanocene compounds described in JP-A-59-152396, JP-A-61-151197, JP-A-63-41484, JP-A-2-249 and JP-A-2-4705, and iron-arene complexes described in JP-A-1-304453 and JP-A-1-152109.

Specific examples of the titanocene compound include dicyclopentadienyl-Ti-dichloride, dicyclopentadienyl-Ti-bisphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)-bis(2,6-difluoro-3-(pyr-1-yl)phenyl) titanium, bis(cyclopentadienyl)bis[2,6-difluoro-3-(methylsulfonamido)phenyl]titanium, bis(cyclopentadienyl)bis[2,6-difluoro-3-(N-butylbiallylamino)phenyl]titanium, bis(cyclopentadienyl)bis[2,6-difluoro-3-(N-butyl-(4-chlorobenzoyl) amino)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(N-(2-ethylhexyl)-4-tolylsulfonyl)amino]phenyl]titanium, bis(cyclopentadienyl)bis[2,6-difluoro-3-(N-(3-oxaheptyl)benzoylamino)phenyl] titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonyl)amino]phenyl]titanium, bis(cyclopentadienyl)bis[2,6-difluoro-3-(trifluoroacetylamino) phenyl]titanium, bis(cyclopentadienyl)bis[2,6-difluoro-3-(2-chlorobenzoyl)amino]phenyl]titanium, bis(cyclopentadienyl)bis[2,6-difluoro-3-(4-chlorobenzoyl) amino]phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis(2,6-difluoro-3-N-(3,7-dimethyl-7-methoxyoctyl)benzoylamino)phenyl]titanium and bis(cyclopentadienyl)bis[2,6-difluoro-3-(N-cyclohexylbenzoylamino)phenyl]titanium.

(j) Active Ester Compound

The (j) active ester compound preferred as the radical initiator for use in the present invention includes imidosulfonate compounds described in JP-B-62-6223, and active sulfonates described in JP-B-63-14340 and JP-A-59-174831.

(k) Compound Having Carbon-Halogen Bond

The (k) compound having a carbon-halogen bond preferred as the radical initiator for use in the present invention includes those represented by the following formulae (6) to (12):

Formula (6):

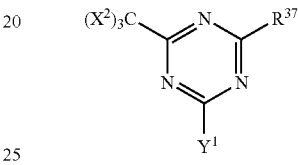

(wherein $X^2$ represents a halogen atom, $Y^1$ represents —$C(X^2)_3$, —$NH_2$, —$NHR^{38}$, —$NR^{38}$ or —$OR^{38}$, $R^{38}$ represents an alkyl group, a substituted alkyl group, an aryl group or a substituted aryl group, and $R^{37}$ represents —$C(X^2)_3$, an alkyl group, a substituted alkyl group, an aryl group, a substituted aryl group or a substituted alkenyl group);

Formula (7):

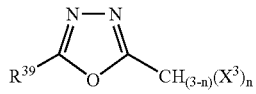

(wherein $R^{39}$ represents an alkyl group, a substituted alkyl group, an alkenyl group, a substituted alkenyl group, an aryl group, a substituted aryl group, a halogen atom, an alkoxy group, a substituted alkoxyl group, a nitro group or a cyano group, $X^3$ represents a halogen atom, and n represents an integer of 1 to 3);

$$R^{40}—Z^6—CH_{(2-m)}(X^3)_m R^{41} \qquad \text{Formula (8):}$$

(wherein $R^{40}$ represents an aryl group or a substituted aryl group, $R^{41}$ represents a group shown below or a halogen, $Z^6$ represents —C(=O)—, —C(=S)— or —SO₂—, $X^3$ represents a halogen atom, and m represents 1 or 2):

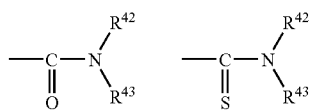

(wherein $R^{42}$ and $R^{43}$ each represents an alkyl group, a substituted alkyl group, an alkenyl group, a substituted alkenyl group, an aryl group or a substituted aryl group, and $R^{44}$ has the same meaning as $R^{38}$ in formula (6));

Formula (9):

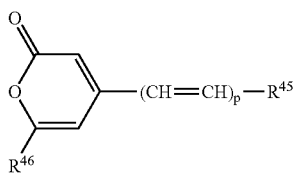

(wherein $R^{45}$ represents an aryl or heterocyclic group which may be substituted, $R^{46}$ represents a trihaloalkyl or trihaloalkenyl group having a carbon number of 1 to 3, and p represents 1, 2 or 3), Formula (10):

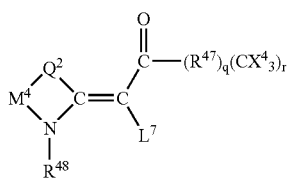

(formula (10) represents a carbonylmethylene heterocyclic compound having a trihalogenomethyl group; wherein $L^7$ represents a hydrogen atom or a substituent represented by the formula: $CO—(R^{47})_q(C(X^4)_3)$, $Q^2$ represents a sulfur, selenium or oxygen atom, a dialkylmethylene group, an alken-1,2-ylene group, a 1,2-phenylene group or an N—R group, $M^4$ represents a substituted or unsubstituted alkylene or alkenylene group, or a 1,2-arylene group, $R^{48}$ represents an alkyl group, an aralkyl group or an alkoxyalkyl group, $R^{47}$ represents a carbocyclic or heterocyclic divalent aromatic group, $X^4$ represents a chlorine, bromine or iodine atom, and q=0 and r=1, or q=1 and r=1 or 2);

Formula (11):

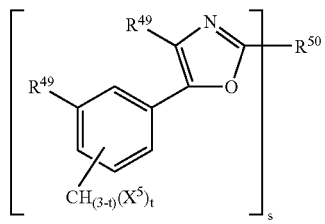

(formula (11) represents a 4-halogeno-5-(halogenomethylphenyl)oxazole derivative; wherein $X^5$ represents a halogen atom, t represents an integer of 1 to 3, s represents an integer of 1 to 4, $R^{49}$ represents a hydrogen atom or a $CH_{3-t}X^5_t$ group, and $R^{50}$ represents an s-valent unsaturated organic group which may be substituted); and Formula (12):

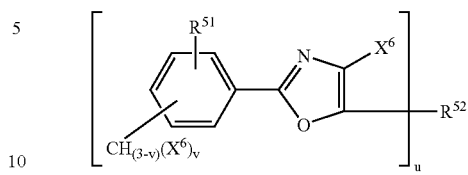

(formula (12) represents a 2-(halogenomethylphenyl)-4-halogeno-oxazole derivative; wherein $X^6$ represents a halogen atom, v represents an integer of 1 to 3, u represents an integer of 1 to 4, $R^{51}$ represents a hydrogen atom or a $CH_{3-v}X^6_v$ group, and $R^{52}$ represents a u-valent unsaturated organic group which may be substituted).

Specific examples of the compound having a carbon-halogen bond include compounds described in Wakabayashi et al., Bull. Chem. Soc. Japan, 42, 2924 (1969), such as 2-phenyl-4,6-bis(trichloromethyl)-S-triazine, 2-chlorophenyl)-4, 6-bis(trichloromethyl)-S-triazine, 2-(p-tolyl)-4,6-bis (trichloromethyl)-S-triazine, 2-(p-methoxyphenyl)-4,6-bis (trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; compounds described in British Patent 1,388,492, such as 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxystyryl)-4-amino-6-trichloromethyl-S-triazine; compounds described in JP-A-53-133428, such as 2-(4-methoxynaphtho-1-yl)-4,6-bis-trichloromethyl-S-triazine, 2-(4-ethoxynaphtho-1-yl)-4,6-bis-trichloromethyl-S-triazine, 2-[4-(2-ethoxyethyl)naphtho-1-yl]-4,6-bis-trichloromethyl-S-triazine, 2-(4,7-dimethoxynaphtho-1-yl)-4,6-bis-trichloromethyl-S-triazine and 2-(acenaphtho-5-yl)-4,6-bis-trichloromethyl-S-triazine; compounds described in German Patent No. 3,337,024, such as compounds shown below; and compounds which can be easily synthesized by one skilled in the art according to the synthesis method described in M. P. Hutt, E. F. Elslager and L. M. Herbel, Journal of Heterocyclic Chemistry, Vol. 7 (No. 3), page 511 et seq. (1970), such as compounds shown below.

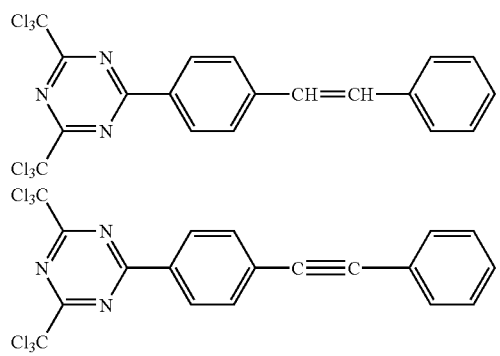

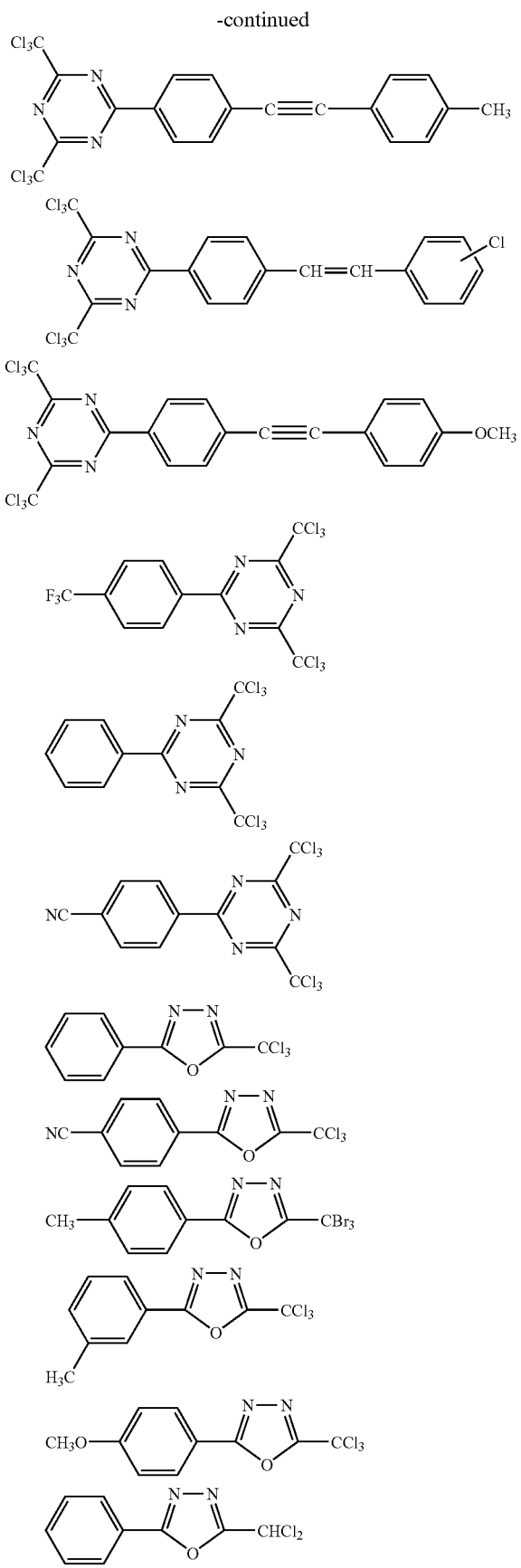

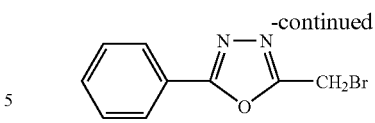

(l) Azo-Based Compound

Examples of the (l) azo-based compound preferred as the radical initiator for use in the present invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamidooxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide] and 2,2'-azobis(2,4,4-trimethylpentane).

More preferred examples of the radical initiator for use in the present invention include the above-described (a) aromatic ketones, (b) onium salt compound, (c) organic peroxide, (e) hexaarylbiimidazole compound, (i) metallocene compound and (k) compound having a carbon-halogen bond, and most preferred examples thereof include an aromatic iodonium salt, an aromatic sulfonium salt, a titanocene compound and a trihalomethyl-S-triazine compound represented by formula (6).

The initiator may be added in a ratio of generally from 0.1 to 50 mass %, preferably from 0.5 to 30 mass %, more preferably from 5 to 20 mass %, based on the entire solid content of the polymerizable compound-containing composition.

The initiators for use in the present invention are suitably used individually or in combination of two or more thereof.

These examples of the initiator or the following examples of the co-sensitizer are partially overlapped with the photo-latent or heat-latent catalyst and in the case of using such a component, the total amount used of the component and the photo-latent or heat-latent catalyst is preferably within the above-described range for the suitable amount of the photo-latent or heat-latent catalyst used.

<Sensitizing Dye>

In the present invention, when a laser emitting an infrared ray at 760 to 1,200 nm (e.g., YAG laser, semiconductor laser) is employed as the light source, an infrared absorbent is usually used. The infrared absorbent absorbs laser light and generates heat to accelerate the thermal decomposition. The infrared absorbent used in the present invention is a dye or pigment having an absorption maximum at a wavelength of 760 to 1,200 nm.

As for the dye, commercially available dyes and known dyes described in publications such as Senryo Binran (Handbook of Dyes) (compiled by The Synthetic Organic Chemistry, Japan (1970)) may be used. Specific examples thereof include a dye such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt and metal thiolate complex.

Preferred examples of the dye include cyanine dyes described in JP-A-58-125246, JP-A-59-84356, JP-A-59-

202829 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, near infrared absorbing sensitizers described in U.S. Pat. No. 5,156,938 may be suitably, used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-based compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 may also be preferably used. Other preferred examples of the dye include near infrared absorbing dyes represented by formulae (I) and (II) of U.S. Pat. No. 4,756,993.

Also, other preferred examples of the infrared absorbing coloring matter for use in the present invention include specific indolenine cyanine dyes described in JP-A-2002-278057.

Among these dyes, preferred are a cyanine dye, a squarylium dye, a pyrylium salt, a nickel thiolate complex and an indolenine cyanine dye, more preferred are a cyanine dye and an indolenine cyanine dye.

Specific examples of the cyanine dye which can be suitably used in the present invention include those described in JP-A-2001-133969 (paragraphs [0017] to [0019]), JP-A-2002-40638 (paragraphs [0012] to [0038]), and JP-A-2002-23360 (paragraphs [0012] to [0023]).

The coloring matter represented by the following formula (d) or (e) is preferred in view of light-to-heat conversion.

Formula (d):

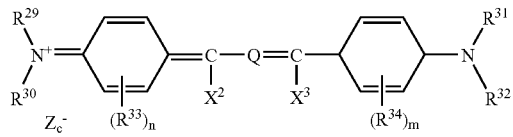

In formula (d), $R^{29}$ to $R^{31}$ each independently represents a hydrogen atom, an alkyl group or an aryl group. $R^{33}$ and $R^{34}$ each independently represents an alkyl group, a substituted oxy group or a halogen atom. n and m each independently represents an integer of 0 to 4. The pair of $R^{29}$ and $R^{30}$ or the pair of $R^{31}$ and $R^{32}$ may combine with each other to form a ring. Also, $R^{29}$ and/or $R^{30}$ may combine with $R^{33}$ to form a ring, or $R^{31}$ and/or $R^{32}$ may combine with $R^{34}$ to form a ring. In the case where a plurality of $R^{33}$s or $R^{34}$s are present, $R^{33}$s or $R^{34}$s may combine with each other to form a ring. $X^2$ and $X^3$ each independently represents a hydrogen atom, an alkyl group or an aryl group, provided that at least one of $X^2$ and $X^3$ represents a hydrogen atom or an alkyl group. Q represents a trimethine or pentamethine group which may have a substituent and may form a ring structure together with a divalent organic group. $Zc^-$ represents a counter anion. However, $Zc^-$ is not necessary when the coloring matter represented by formula (d) has an anionic substituent in its structure and neutralization of electric charge is not needed. In view of storage stability of the coating solution for photosensitive layer, $Zc^-$ is preferably a halogen ion, a perchlorate ion, a tetrafluoroborate ion, a hexafluorophosphate ion or a sulfonate ion, more preferably a perchlorate ion, a hexafluorophosphate ion or an arylsulfonate ion.

Specific examples of the dye represented by formula (d) which can be suitably used in the present invention include those shown below.

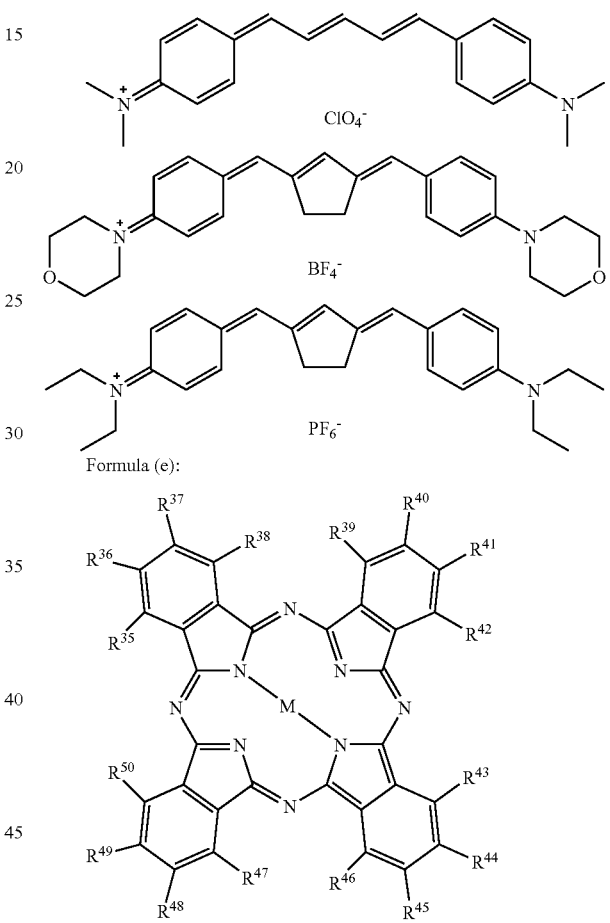

Formula (e):

In formula (e), $R^{35}$ to $R^{50}$ each independently represents a hydrogen atom, a halogen atom, a cyano group, an alkyl group, an aryl group, an alkenyl group, an alkynyl group, a hydroxy group, a carbonyl group, a thio group, a sulfonyl group, a sulfinyl group, an oxy group, an amino group or an onium salt structure. These groups each may have a substituent when a substituent can be introduced thereinto. M represents two hydrogen atoms, a metal atom, a halometal group or an oxymetal group, and examples of the metal atom contained therein include atoms of Groups IA, IIA, IIIB and IVB of the Periodic Table, transition metals of first, second and third periods, and lanthanoid element. Among these, copper, magnesium, iron, zinc, cobalt, aluminum, titanium and vanadium are preferred.

Specific examples of the dye represented by formula (e) which can be suitably used in the present invention include those shown below.

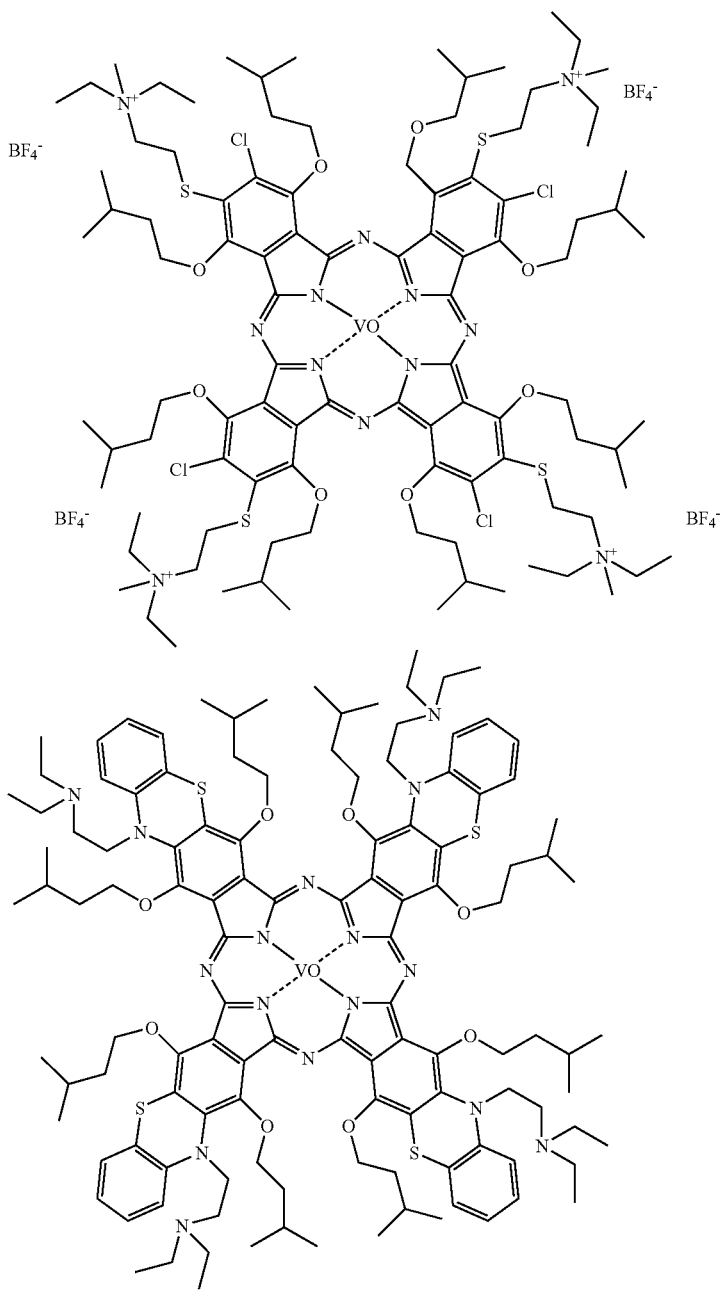

As regards the pigment for use in the present invention, commercially available pigments and pigments described in Color Index (C.I.) Binran (C.I. Handbook), Saishin Ganryo Binran (Handbook of Newest Pigments), compiled by Nippon Ganryo Gijutsu Kyokai (1977), Saishin Ganryo Oyo Gijutsu (Newest Pigment Application Technology), CMC (1986), and Insatsu Ink Gijutsu (Printing Ink Technology), CMC (1984) can be used.

The kind of the pigment includes a black pigment, a yellow pigment, an orange pigment, a brown pigment, a red pigment, a violet pigment, a blue pigment, a green pigment, a fluorescent pigment, a metal powder pigment and a polymer bond coloring matter. Specific examples of the pigment which can be used include an insoluble azo pigment, an azo lake pigment, a condensed azo pigment a chelate azo pigment, a phthalocyanine-based pigment, an anthraquinone-based pigment, a perylene- or perynone-based pigment, a thioindigo-based pigment, a quinacridone-based pigment, a dioxazine-based pigment, an isoindolinone-based pigment, a quinophthalone-based pigment, a dyed lake pigment, an azine pigments, a nitroso pigment, a nitro pigment, a natural pigment, a fluorescent pigment, an inorganic pigment and carbon black. Among these pigments, carbon black is preferred.

These pigments each may or may not be surface-treated before use. The surface treatment may be performed, for example, by a method of coating the surface with resin or wax, a method of attaching a surfactant, or a method of bonding a reactive substance (for example, a silane coupling agent, an epoxy compound or polyisocyanate) to the pigment surface. These surface treatment methods are described in Kinzoku Sekken no Seishitsu to Oyo (Properties and Applications of Metal Soap), Saiwai Shobo, Insatsu Ink Gijutsu (Printing Ink Technology), CMC (1984), and Saishin Ganryo Oyo Gijutsu (Newest Pigment Application Technology), CMC (1986).

The particle diameter of the pigment is preferably from 0.01 to 10 μm, more preferably from 0.05 to 1 μm, still more preferably from 0.1 to 1 μm. When the particle diameter of the pigment is 0.01 μm or more, stability of the dispersion in the coating solution is increased, whereas when it is 10 μm or less, good uniformity of the resin composition layer is obtained.

As regards the method for dispersing the pigment, known dispersion techniques employed, for example, in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in Saishin Ganryo Oyo Gijutsu (Newest Pigment Application Technology), CMC (1986).

<Co-Sensitizer>

The sensitivity at the time of photo-curing the resin composition layer can be further enhanced by using a certain kind of additive (hereinafter referred to as a "co-sensitizer"). The operation mechanism of the co-sensitizer is not clearly known but is considered to be mostly based on the following chemical process. That is, the co-sensitizer reacts with various intermediate active species (e.g., radical, cation) generated in the process of a photo-reaction initiated by the photopolymerization initiator and a subsequent addition-polymerization reaction to produce new active radicals. The co-sensitizers are roughly classified into (a) a compound which is reduced to produce an active radical, (b) a compound which is oxidized to produce an active radical, and (c) a compound which reacts with a radical having low activity to convert it into a more highly active radical or acts as a chain transfer agent. However, in many cases, a common view regarding to which type individual compounds belong is not present.

(a) Compound which is Reduced to Produce an Active Radical

Compound Having a Carbon-Halogen Bond:

An active radical is considered to be generated resulting from reductive cleavage of the carbon-halogen bond. Specific examples of this compound which can be suitably used include trihalomethyl-s-triazines and trihalomethyloxadiazoles.

Compound Having a Nitrogen-Nitrogen Bond:

An active radical is considered to be generated resulting from reductive cleavage of the nitrogen-nitrogen bond. Specific examples of this compound which can be suitably used include hexaarylbiimidazoles.

Compound Having an Oxygen-Oxygen Bond:

An active radical is considered to be generated resulting from reductive cleavage of the oxygen-oxygen bond. Specific examples of this compound which can be suitably used include organic peroxides.

Onium Compound:

An active radical is considered to be generated resulting from reductive cleavage of a carbon-hetero bond or an oxygen-nitrogen bond. Specific examples of this compound which can be suitably used include diaryliodonium salts, triarylsulfonium salts and N-alkoxypyridinium (azinium) salts.

Ferrocene and Iron Arene Complexes:

An active radical is reductively produced.

(b) Compound which is Oxidized to Produce an Active Radical

Alkyl-Ate Complex:

An active radical is considered to be generated resulting from oxidative cleavage of a carbon-hetero bond. Specific examples of this compound which can be suitably used include triarylalkylborates.

Alkylamine Compound:

An active radical is considered to be generated resulting from oxidative cleavage of a C—X bond on the carbon adjacent to nitrogen. X is preferably, for example, a hydrogen atom, a carboxyl group, a trimethylsilyl group or a benzyl group. Specific examples of this compound include ethanolamines, N-phenylglycines and N-trimethylsilylmethylanilines.

Sulfur-Containing or Tin-Containing Compound:

The above-described amines in which the nitrogen atom is replaced with a sulfur atom or a tin atom can produce an active radical by the same action. Also, a compound having an S—S bond is known to effect sensitization by the S—S cleavage.

α-Substituted Methylcarbonyl Compound:

An active radical can be produced resulting from oxidative cleavage of the bond between carbonyl-α carbon. The compound in which the carbonyl is converted into an oxime ether also shows the same activity. Specific examples of this compound include 2-alkyl-1-[4-(alkylthio)phenyl]-2-morpholinopronone-1 compounds and oxime ethers obtained by reacting such a compound with hydroxyamines and then etherifying the N—OH.

Sulfinic Acid Salts:

An active radical can be reductively produced. Specific examples of this compound include sodium arylsulfinate.

(c) Compound which Reacts with a Radical to Convert it into a Highly Active Radical or Acts as a Chain Transfer Agent For example, compounds having SH, PH, SiH or GeH in the molecule may be used. Such a compound can produce a radical by donating hydrogen to a low-activity radical species or by being oxidized and then deprived of a proton. Specific examples of this compound include 2-mercaptobenzothiazoles, 2-mercaptobenzoxazoles and 2-mercaptobenzimidazoles.

A large number of examples of the co-sensitizer are more specifically described, for example, in JP-A-9-236913 as an additive for enhancing the sensitivity, and these can be applied also to the present invention. Some of these are set forth below, but the present invention is not limited thereto. In the formula below, -TMS indicates a trimethylsilyl group.

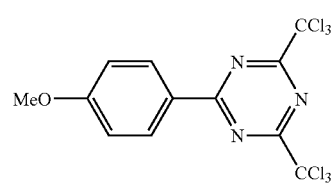

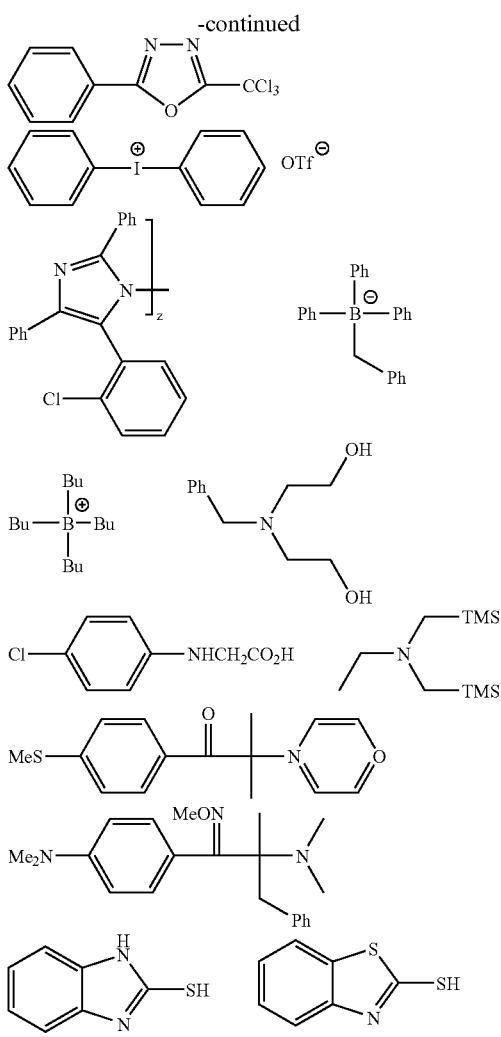

Similarly to the above-described sensitizing dye, the co-sensitizer can be subjected to various chemical modifications so as to improve the characteristics of the resin composition layer. For example, methods such as binding to a sensitizing dye, initiator compound, addition-polymerizable unsaturated compound or other parts, introduction of a hydrophilic moiety, introduction of a substituent for enhancing the compatibility or inhibiting the crystal deposition, introduction of a substituent for enhancing the adhesion property, and formation into a polymer, may be used.

The co-sensitizers may be used individually or in combination of two or more thereof. The amount of the co-sensitizer used is from 0.05 to 100 parts by mass, preferably from 1 to 80 parts by mass, more preferably from 3 to 50 parts by mass, per 100 parts by mass of the compound having an ethylenically unsaturated double bond.

<Polymerization Inhibitor>

In the present invention, in addition to these components, a small amount of a thermopolymerization inhibitor is preferably added so as to prevent unnecessary thermopolymerization of the polymerizable ethylenically unsaturated double bond-containing compound during the production or storage of the composition. Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitrosophenylhydroxyamine cerous salt. The amount of the thermopolymerization inhibitor added is preferably from about 0.01 to about 5 mass % based on the mass of the entire composition. Also, if desired, a higher fatty acid derivative or the like, such as behenic acid and behenic acid amide, may be added and allowed to localize on the layer surface in the process of drying after coating on a support or the like so as to prevent polymerization inhibition by oxygen. The amount of the higher fatty acid derivative added is preferably from about 0.5 to about 10 mass % based on the entire composition.

<Colorant>

Furthermore, a colorant such as dye and pigment may be added for the purpose of coloring the resin composition layer. By this addition, properties such as visibility of the image part or suitability for the image densitometer can be enhanced. As for the colorant, use of a pigment is particularly preferred. Specific examples of the colorant include a pigment such as phthalocyanine-based pigment, azo-based pigment, carbon black and titanium oxide, and a dye such as Ethyl Violet, Crystal Violet, azo-based dye, anthraquinone-based dye and cyanine-based dye. The amount of the colorant added is preferably from about 0.5 to about 5 mass % based on the entire composition.

<Other Additives>

Furthermore, known additives such as filler and plasticizer may be added for improving the physical properties of the cured film.

The filler may be an organic compound, an inorganic compound or a mixture thereof. Examples of the organic compound include carbon black, carbon nanotube, fullerene and graphite. Examples of the inorganic compound include silica, alumina, aluminum and calcium carbonate.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerin, and when a binder is used, the plasticizer may be added in an amount of 10 mass % or less based on the total mass of the ethylenically unsaturated double bond-containing compound and the binder <Pattern-Forming Material>

The pattern-forming material of the present invention is characterized by having a layer comprising the composition of the present invention on a support. The layer comprising the composition (hereinafter sometimes referred to as a pattern-forming layer) contains the components (A) and (B). Also, the composition for the pattern-forming layer may further contain the above-described polymerizable compound, initiator and other components, if desired. Furthermore, the pattern-forming layer may be a layer formed by curing the composition through crosslinking (polymerization) before laser decomposition.

The pattern-forming material characterized by having a layer comprising the laser-decomposable resin composition, as used in the present invention, means a pattern-forming material in general where the area exposed to a laser works out to a trough of a corrugated pattern. The trough may be formed by applying a heat treatment or a development processing with an aqueous alkali solution or the like after laser exposure, but the pattern-forming material of the present invention is suitably used in the case of forming a trough directly (through ablation) by laser exposure.

The pattern-forming material suitably used in the present invention is not particularly limited in its usage as long as it has the above-described property, and is applicable in various uses such as printing plate precursor (e.g., lithographic, gravure, letterpress, screen), printed wiring board, semiconductor photoresist material and optical disc recording material. In the present invention, the pattern-forming material of the present invention is preferably used as a printing plate for plate making by direct engraving with a laser, that is, so-called "laser engraving", more preferably as a flexographic printing plate, and most preferably as a laser-engravable flexographic printing plate precursor.

(Support)

In the present invention, a material having flexibility and excellent dimensional stability is preferably used for the support of the pattern-forming material, and examples thereof include a polyethylene terephthalate film, a polyethylene naphthalate film, a polybutylene terephthalate film and a polycarbonate film. In view of mechanical properties, shape stability, handleability and the like of the pattern-forming material, the thickness of the support is preferably from 50 to 350 μm, more preferably from 100 to 250 μm. Also, in order to enhance the adhesion between the support and the pattern-forming layer, a known adhesive layer conventionally used for such a purpose may be provided on the support surface, if desired.

Furthermore, the adhesive property to the pattern-forming layer or adhesive layer can be enhanced by applying a physical or chemical treatment to the surface of the support for use in the present invention. Examples of the physical treatment include a sand blast method, a wet blast method of jetting a fine particle-containing liquid, a corona discharge treatment, a plasma treatment, and an ultraviolet or vacuum ultraviolet irradiation treatment. Examples of the chemical treatment include a strong acid treatment, a strong alkali treatment, an oxidant treatment, and a coupling agent treatment.

(Formation of Film)

In order to shape the composition of the present invention into a sheet form, a roll form or a cylindrical form, an existing resin-shaping method can be used. Examples thereof include a casting method and a method of extruding the composition from a nozzle or die by using a machine such as pump or extruder and adjusting the thickness with a blade or through calendering by a roller. At this time, the shaping can also be performed under heating within the range of not impairing the performance of the composition. If desired, a rolling treatment, a grinding treatment or the like may also be applied. In many cases, the composition is usually shaped on an underlay called a back film comprising a material such as PET and nickel. Furthermore, a cylindrical substrate made of fiber reinforced plastic (FRP), plastic or metal can also be used. A hollow cylindrical substrate having a constant thickness can be used for reducing the weight. The role of the back film or cylindrical substrate is to ensure the dimensional stability of the pattern-forming material. Accordingly, a material having high dimensional stability should be selected. Specific examples of the material include a polyester resin, a polyimide resin, a polyamide resin, polyamideimide resin, a polyetherimide resin, polybismaleimide resin, a polysulfone resin, a polycarbonate resin, a polyphenylene ether resin, a polyphenylene thioether resin, a polyethersulfone resin, a crystalline resin comprising wholly aromatic polyester resin, a wholly aromatic polyamide resin, and an epoxy resin. These resins may be used in the form of a laminate. For example, a sheet obtained by stacking a polyethylene terephthalate layer having a thickness of 50 μm on both surfaces of a wholly aromatic polyamide film having a thickness of 4.5 μm may also be used. Furthermore, a porous sheet, for example, a cloth formed by knitting fibers, a nonwoven fabric or a film having formed therein fine pores, can be used as the back film. In the case of using a porous sheet as the back film, when the composition is impregnated into the pores and then photo-cured, the cured composition layer and the back film are integrated, so that a high adhesive property can be obtained. Examples of the fiber forming the cloth or nonwoven fabric include an inorganic fiber such as glass fiber, alumina fiber, carbon fiber, alumina-silica fiber, boron fiber, high silicon fiber, potassium titanate fiber and sapphire fiber; a natural fiber such as cotton and hemp; a semisynthetic fiber such as rayon and acetate; and a synthetic fiber such as nylon, polyester, acryl, vinylon, polyvinyl chloride, polyolefin polyurethane, polyimide and aramid. In addition, cellulose produced by a bacterium is a high crystalline nanofiber and is a material capable of producing a thin nonwoven fabric having high dimensional stability.

From the standpoint of enhancing the strength of the film formed, the laser-decomposable resin composition of the present invention is preferably cured by crosslinking (polymerization) before decomposition with a laser. For curing the composition, the above-described polymerizable compound is preferably contained in the composition. This is generally employed as means for increasing the film strength in the field of negative (polymerization-type) photosensitive material and is considered to produce the same effect also in the present invention. When the above-described polymer compound-containing laser-decomposable resin composition according to the present invention is cured in this way, the removability of debris generated during laser engraving is more enhanced. This method is effective particularly when the pattern-forming material is a laser-engravable flexographic printing plate precursor. Curing before laser engraving is advantageous in that the relief formed after laser engraving becomes sharp and the viscous property of engraving debris generated during laser engraving is reduced.

As regards the method for curing the composition, any means can be used without particular limitation as long as it causes a polymerization reaction of the polymerizable compound, for example, the composition may be heated or irradiated with light, or the composition having added thereto a photo- or thermo-polymerization initiator or the like may be irradiated with light or heated.

Above all, in view of simple operation, heating of the composition is preferred as the method for curing. All heating methods such as oven, thermal head, heated roll and laser beam can be applied to the heating for causing crosslinking (polymerization) in the composition before laser decomposition. In the case where the temperature needs to be controlled, this can be attained by controlling the temperature of oven, thermal head, heated roll or the like, or adjusting the intensity or spot size of laser beam. In view of thermal stability of the organic compound present together, the heating temperature is preferably from 40 to 250° C., more preferably form 60 to 220° C., still more preferably from 80 to 200° C.

The thickness of the resin composition layer is generally from 0.0005 to 10 mm, preferably from 0.005 to 7 mm.

In the case of use for laser engraving (particularly a laser-engravable flexographic printing plate precursor), the thickness may be arbitrarily selected according to the intended use but is preferably from 0.05 to 10 mm, more preferably from 0.1 to 7 mm. Depending on the case, a plurality of layers differing in the composition may be stacked.

As regards the combination comprising a plurality of layers, for example, a layer which can be engraved with a laser having an emission wavelength in the near infrared region, such as YAG laser, fiber laser and semiconductor laser, may be formed as the outermost surface layer, and a layer which can be laser-engraved with an infrared laser such as carbon dioxide gas laser or with a visible-ultraviolet laser may be formed below the outermost surface layer. In the case of laser-engraving these layers, the engraving can be performed using different laser engraving devices where an infrared laser is mounted in one device and a near infrared laser is mounted in another device, or using a laser engraving device on which both an infrared laser and a near infrared laser are mounted.

In the present invention, a cushion layer comprising a resin or rubber having cushioning property can be formed between the support and the pattern-forming layer or between the pattern-forming layer and the adhesive layer. In the case of forming a cushion layer between the support and the pattern-forming layer, a method of laminating a cushion layer having on one side thereof an adhesive layer while arranging the adhesive layer side toward the support is simple. After laminating the cushion layer, the surface may be shaped through cutting and polishing. In a simpler method, a liquid adhesive composition is coated on the support to a constant thickness and cured with light to form a cushion layer. For ensuring the cushioning property, the cured product after photo-curing preferably has low hardness. The photosensitive resin cured layer having the cushioning property may contain bubbles.

<Laser Engraving>

In the laser engraving, a relief image is formed on the pattern-forming material by creating digitized data of an image intended to form and operating a laser device by means of a computer.

As described above, the pattern-forming material for use in the laser engraving is not particularly limited, but above all, a laser-engravable flexographic printing plate precursor is preferred.

The laser used in the laser engraving may be any laser as long as the pattern-forming material can form a pattern by laser ablation, but in order to perform the engraving at a high speed, a high-power laser is preferred. One preferred example thereof is a laser leaving an emission wavelength in the infrared or near infrared region, such as carbon dioxide gas laser, YAG laser, semiconductor laser and fiber laser. Also, an ultraviolet laser having an emission wavelength in the ultraviolet region, such as excimer laser, YAG laser wavelength-converted to the third or fourth harmonic, and copper vapor laser, can effect the ablation processing of breaking a molecular bond of an organic compound and is suitable for microfabrication. A laser having an extremely high peak power, such as femtosecond laser, can also be used. The laser irradiation may be either continuous irradiation or pulsed irradiation. For the laser-engravable flexographic printing plate precursor, a carbon dioxide gas laser and a YAG laser are preferably used.

The engraving with a laser is performed under an oxygen-containing gas generally in the presence of air or in airflow but may also be performed under a carbon dioxide gas or a nitrogen gas. After the completion of engraving, the powdery or liquid substance (debris) generated on the relief image surface can be removed by an appropriate method, for example, a method of washing it out with a solvent or a surfactant-containing water, a method of spraying an aqueous cleaning agent by means of a high-pressure sprayer or the like, a method of spraying high-pressure steam, or a method of wiping it off with cloth or the like.

The composition of the present invention can be applied not only to the relief image but also to various uses such as stamp/seal, design roll for embossing, relief image for patterning an insulator, resistor or electrical conductor paste used for the production of electronic components, relief image for the mold material of ceramic products, relief image for display (e.g., advertising board, sign board), and prototype/matrix of various molded articles.

Furthermore, tackiness on the surface can be reduced by forming a modifying layer on the pattern image surface after laser engraving. Examples of the modifying layer include a coating treated with a compound which reacts with the hydroxy group on the pattern image surface, such as silane coupling agent and titanium coupling agent, and a polymer film containing porous inorganic particles. The silane coupling agent widely used is a compound having in its molecule a functional group highly reactive with the hydroxy group on the pattern image surface, and examples of the functional group include a trimethoxysilyl group, a triethoxysilyl group, a trichlorosilyl group, a diethoxysilyl group, a dimethoxysilyl group, a dichlorosilyl group, a monoethoxysilyl group, a monomethoxysilyl group and a monochlorosilyl group. At least one of these functional groups is present in the molecule and reacts with the hydroxyl group on the pattern image surface, whereby the compound is fixed on the surface. As regards the compound constituting the silane coupling agent for use in the present invention, a compound having in the molecule thereof at least one reactive functional group selected from an acryloyl group, a methacryloyl group, an active halogen-containing amino group, an epoxy group, a vinyl group, a perfluoroalkyl group and a mercapto group, or a compound having a long chain alkyl group may also be used. Particularly, in the case where the molecule of the coupling agent fixed on the surface has a polymerizable reactive group, crosslinking occurs when the surface after fixing is irradiated with light, heat or electron beam, and a firmer coating can be thereby formed.

EXAMPLES

The present invention is described in greater detail below by referring to Examples, but the present invention should not be construed as being limited to these Examples.

Model Decomposition Test

Examples 1 to 8 and Comparative Example 1

A pattern-forming layer was formed using the following composition.

Sample Formulation of Examples 1 to 8 and Comparative Example 1

Polymer compound containing a structure represented by 80 mass %
formula (0) as a repeating unit in the main chain of the present invention: shown in Table 1 below
Photo-latent or heat-latent catalyst: shown in Table 1 below
20 mass %

The sample above was dissolved in THF (prepared as a solution having a solid content concentration of 10 wt %), and the obtained solution was cast in portions of 10 g each into aluminum cups and dried in air at room temperature for 24 hours to obtain model decomposition test samples (before heating).

These samples were heated in an oven at 200° C. for 2 minutes to obtain model decomposition samples (after heating). The model decomposition samples (before eating) and model decomposition samples (after heating) each was re-dissolved in THF, and the molecular weight (mass average molecular weight) was measured using GPC (high-speed GPC system, "HLC-8220GPC", manufactured by Tosoh Corp.).

The results are shown in Table 1.

The polymer compound containing a structure represented by formula (0) as a repeating unit in the main chain of the present invention, the binder polymer, the compound containing a polymerizable unsaturated double bond, the additive

TABLE 1

| Example No. | Photo-Latent or Heat-Latent Catalyst | Polymer Containing Structure of Formula (0) as Repeating Unit in Main Chain | Molecular Weight Before Heating | Molecular Weight After Heating |
| --- | --- | --- | --- | --- |
| 1 | PAG4-3 | P-10 | 11000 | decomposed |
| 2 | PAG4-3 | PA-1 | 20000 | decomposed |
| 3 | PAG4-3 | PA-18 | 25000 | 2000 |
| 4 | PAG2-3 | PA-28 | 13000 | decomposed |
| 5 | PAG2-3 | PB-7 | 21000 | decomposed |
| 6 | B-2 | PB-29 | 32000 | 10000 |
| 7 | PAG4-3 | PB-30 | 28000 | 2000 |
| 8 | PAG4-3 | PB-34 | 30000 | 3000 |
| Comparative Example 1 | none | PB-30 | 28000 | 28000 |

In the above, the "decomposed" indicates that the polymer was decomposed even to a monomer unit.

It is seen from Table 1 that when a heating test was performed on the sample of the present invention using a combination of a polymer compound having a structure represented by formula (0) as a repeating unit in the main chain and a photo-latent or heat-latent catalyst, as shown in Examples 1 to 8, the molecular weight of each sample was reduced. On the other hand, in Comparative Example 1 where a photo-latent or heat-latent catalyst was not added, the molecular weight was not reduced. This implies that reduction in the molecular weight occurs in the sample of the present invention using a combination of a polymer compound having a structure represented by formula (0) as a repeating unit in the main chain and a photo-latent or heat-latent catalyst.

Laser Decomposition Test

Examples 9 to 25 and Comparative Examples 2 to 5

A pattern-forming layer was formed using the following composition.

<Composition for Pattern-Forming Layer>

| | |
| --- | --- |
| Polymer compound containing a structure represented by formula (0) as a repeating unit in the main chain of the present invention; shown in Table 2 below | X mass % |
| Binder Polymer (styrene-butadiene block copolymer, TR-2000, produced by JSR Corp.): shown in Table 2 below | Y mass % |
| Photo-latent or heat-latent catalyst: shown in Table 2 below | Z mass % |
| Compound containing a polymerizable unsaturated double bond: shown in Table 2 below | W mass % |
| Laser absorbent: fine carbon black | 2.00 mass % |
| Additive (zone decomposition-preventing wax): 1,4-benzoquinone | 1.00 mass % | and the laser absorbent were mixed in a laboratory kneader at a temperature of 100° C. for 15 minutes, thereby uniformly dispersing the laser absorbent. The obtained mixture was dissolved together with the photo-latent or heat-latent catalyst in methylene chloride (when not dissolved, in DMAc) at 60° C., and the resulting solution was cooled 40° C. and then cast on a 125 μm-thick PET film. The coating was dried in air at room temperature for 24 hours and further at 60° C. for 3 hours, and the obtained pattern-forming layer (thickness: 1,000 μm) was laminated (stacked) on a 125 μm-thick PET film having provided thereon an adhesive layer, whereby the pattern-forming layer was transferred to the 125 μm-thick PET film having provided thereon an adhesive layer. Furthermore, in the case where the compound containing a polymerizable unsaturated double bond was added, the sample was heated at 150° C. for 3 minutes to obtain a thermally polymerized sample.

In the evaluation of laser engraving depth, the sample was engraved using "High-Grade $CO_2$ Laser Marker ML-9100 Series (produced by KEYENCE Corp.)" at 12 W and a line speed of 20 cm/sec in the case of a carbonic acid ($CO_2$) laser, and using "MAKER ENGINE 3000 (produced by Laserfront Technologies, Inc.)" at 10 W and a line speed of 10 cm/sec in the case of an Nd-YAG laser, and the difference in the height between the laser irradiated part (trough) and the laser unirradiated part was measured by Super Depth Configuration Measurement Microscope (VK-8500, produced by KEYENCE Corp.). Also, the stability at the thick film formation was rated "A" when a thick film can be formed, rated "13" when a film can be formed though it is sticky, and rated "C" when a decomposition reaction or the like occurs at the thick film formation and a thick film cannot be formed. The results are shown in Table 2.

TABLE 2

| Example No. | Polymer Compound Containing Structure of Formula (0) as Repeating Unit in Main Chain | Photo-Latent or Heat-Latent Catalyst | Binder Polymer | Compound Containing Polymerizable Unsaturated Double Bond | Kind of Laser | Engraving Depth (μm) | Stability at Thick Film Formation |
|---|---|---|---|---|---|---|---|
| 9 | P-10 (80) | PAG4-3 (20) | none | none | $CO_2$ | 600 | B |
| 10 | PA-1 (80) | PAG4-3 (20) | none | none | $CO_2$ | 500 | A |
| 11 | PA-18 (80) | PAG4-3 (20) | none | none | $CO_2$ | 660 | A |
| 12 | PA-18 (80) | B-2 (20) | none | none | $CO_2$ | 500 | A |
| 13 | PA-18 (60) | PAG4-3 (20) | none | M-1 (20) | $CO_2$ | 480 | A |
| 14 | PA-28 (80) | PAG2-3 (20) | none | none | $CO_2$ | 650 | A |
| 15 | PB-7 (80) | PAG4-3 (20) | none | none | $CO_2$ | 480 | A |
| 16 | PB-18 (80) | PAG4-3 (20) | none | none | $CO_2$ | 600 | A |
| 17 | PB-29 (80) | PAG4-3 (20) | none | none | $CO_2$ | 590 | A |
| 18 | PB-30 (80) | PAG4-3 (20) | none | none | $CO_2$ | 660 | A |
| 19 | PB-30 (80) | PAG2-3 (20) | none | none | Nd-YAG | 400 | A |
| 20 | PB-30 (80) | B-2 (20) | none | none | $CO_2$ | 480 | A |
| 21 | PB-30 (80) | R-5 (20) | none | none | $CO_2$ | 410 | A |
| 22 | PB-30 (50) | PAG4-3 (20) | TR-2000 (30) | none | $CO_2$ | 580 | A |
| 23 | PB-30 (40) | PAG4-3 (20) | TR-2000 (20) | M-1 (20) | $CO_2$ | 550 | A |
| 24 | PB-34 (80) | PAG2-3 (20) | none | none | $CO_2$ | 560 | A |
| 25 | PB-41 (80) | PAG2-3 (20) | none | none | $CO_2$ | 500 | A |
| Comparative Example 2 | PR-1 (100) | none | none | none | $CO_2$ | 300 | A |
| Comparative Example 3 | PR-1 (80) | PAG4-3 (20) | none | none | $CO_2$ | 300 | A |
| Comparative Example 4 | none | none | TR-2000 (100) | none | $CO_2$ | 400 | A |
| Comparative Example 5 | none | none | TR-2000 (100) | none | Nd-YAG | 200 | A |

M-1

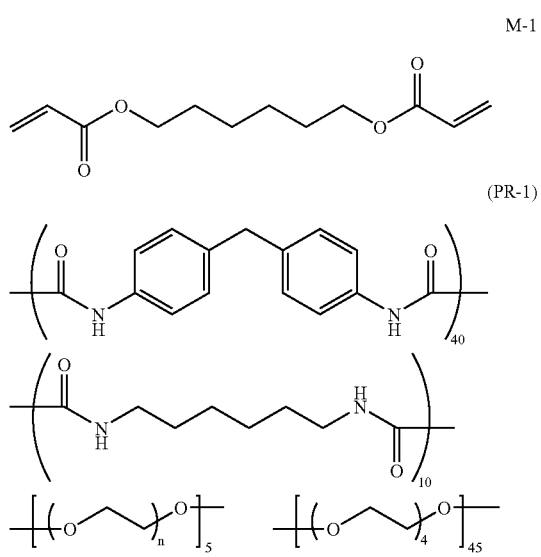

(PR-1)

In PR-1, the mass average molecular weight of the following unit is 1,000.

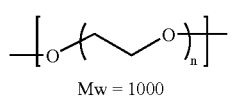

Mw = 1000

It is seen from Table 2 that in Examples 9 to 25 which are Examples of the present invention, the engraving depth indicative of decomposability in the laser decomposition test is large as compared with Comparative Examples where the combination of the present invention of a polymer compound containing a structure represented by formula (0) in the main chain and a photo-latent or heat-latent catalyst is not added. Considering the data of the model test, this reveals that the main chain of the polymer compound is broken by an active species generated upon decomposition of the photo-latent or heat-latent catalyst and the molecular weight of the polymer compound is decreased, as a result, the decomposability can be enhanced while keeping the stability at the thick film formation.

According to the present invention, a laser-decomposable resin composition which is applicable also to a thick film, exhibits high engraving sensitivity, enables efficient engraving with a low laser energy and is excellent in the stability, and a pattern-forming material using the composition can be provided.

The entire disclosure of each and every foreign patent application from which the benefit of foreign priority has been claimed in the present application is incorporated herein by reference, as if fully set forth.

What is claimed is:

1. A laser-decomposable resin composition, comprising:
   (A) a polymer compound containing a structure represented by formula (0) as a repeating unit in a main chain of the polymer compound:

(0)

wherein $R_1$ represents H or a hydrocarbyl group which may have a substituent;

(B) a photo-latent or heat-latent catalyst; and
a compound containing a polymerizable unsaturated double bond.

2. The laser-decomposable resin composition according to claim 1,
wherein the polymer compound is a polymer compound obtained by polymerizing a compound represented by formula (1) as at least one polymerization component:

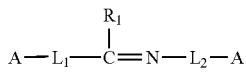

(1)

wherein $R_1$ represents H or a hydrocarbyl group which may have a substituent;
$L_1$ and $L_2$ each independently represents a divalent linking group;
A represents OH, SH, $NR_2H$, $CO_2H$, $CO_2R_2$, COX, NCO or NCS;
$R_2$ represents a hydrogen atom or a monovalent substituent; and
X represents a halogen atom.

3. The laser-decomposable resin composition according to claim 1,
wherein the polymer compound is a polymer compound obtained by polycondensation or polyaddition reaction of the compound represented by formula (1) and a bifunctional compound capable of reacting with the compound represented by formula (1).

4. The laser-decomposable resin composition according to claim 1,
wherein the polymer compound is polyurethane, polyamide, polyurea, polyether or polyester.

5. The laser-decomposable resin composition according to claim 4,
wherein the polymer compound is polyurethane.

6. The laser-decomposable resin composition according to claim 1,
wherein the heat-latent catalyst is an acid generator.

7. The laser-decomposable resin composition according to claim 1,
wherein the polymer compound is a polymer compound obtained by polymerizing a compound represented by formula (2) as at least one polymerization component:

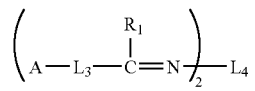

(2)

wherein $R_1$ represents H or a hydrocarbyl group which may have a substituent;
$L_3$ and $L_4$ each independently represents a divalent linking group;
A represents OH, SH, $NR_2H$, $CO_2H$, $CO_2R_2$, COX, NCO or NCS;
$R_2$ represents a hydrogen atom or a monovalent substituent; and
X represents a halogen atom.

8. The laser-decomposable resin composition according to claim 7,
wherein the polymer compound is a polymer compound obtained by polycondensation or polyaddition reaction of the compound represented by formula (2) and a bifunctional compound capable of reacting with the compound represented by formula (2).

9. A laser-decomposable resin composition obtained by curing the laser-decomposable resin composition according to claim 1.

10. A pattern-forming material, comprising:
a layer comprising the laser-decomposable resin composition according to claim 1.

11. The pattern-forming material according to claim 10, which is a laser-engravable flexographic printing plate precursor.

* * * * *